(12) United States Patent
Berthet et al.

(10) Patent No.: US 7,170,948 B2
(45) Date of Patent: Jan. 30, 2007

(54) METHOD AND SYSTEM OF ITERATIVE CODING/DECODING OF DIGITAL DATA STREAMS CODED BY SPATIO-TEMPORAL COMBINATIONS, IN MULTIPLE TRANSMISSION AND RECEPTION

(75) Inventors: Antoine Berthet, Chatenay (FR); Raphaël Visoz, Issy les Moulineaux (FR)

(73) Assignee: France Telecom, Paris (FR)

( * ) Notice: Subject to any disclaimer, the term of this patent is extended or adjusted under 35 U.S.C. 154(b) by 711 days.

(21) Appl. No.: 10/075,721

(22) Filed: Feb. 14, 2002

(65) Prior Publication Data

US 2002/0168017 A1 Nov. 14, 2002

(30) Foreign Application Priority Data

Feb. 21, 2001 (FR) .................................. 01 02343

(51) Int. Cl.
*H04L 1/02* (2006.01)
(52) U.S. Cl. ...................... 375/267; 375/265; 375/341; 375/347
(58) Field of Classification Search ................ 375/260, 375/265, 267, 285, 295, 316, 341, 347–349; 370/335, 337, 347, 204, 342; 455/132, 137, 455/269, 272, 273, 278.1; 714/752, 786, 714/755
See application file for complete search history.

(56) References Cited

U.S. PATENT DOCUMENTS

| 6,128,330 | A | 10/2000 | Schilling | |
|---|---|---|---|---|
| 6,317,411 | B1 * | 11/2001 | Whinnett et al. ............. | 370/204 |
| 6,353,637 | B1 * | 3/2002 | Mansour et al. ............. | 375/260 |
| 6,483,828 | B1 * | 11/2002 | Balachandran et al. ..... | 370/342 |
| 6,584,593 | B1 * | 6/2003 | Seshadri et al. ............. | 714/752 |
| 6,678,263 | B1 * | 1/2004 | Hammons et al. .......... | 370/342 |

(Continued)

OTHER PUBLICATIONS

L.R.Bahl et al. "Optimal decoding of linear codes for minimizing symbol error rate", IEEE France. Inform. Theory, vol. IT-20, pp. 284-287, Mar. 1974.

(Continued)

*Primary Examiner*—Khanh Tran
(74) *Attorney, Agent, or Firm*—Gardner Carton & Douglas LLP

(57) ABSTRACT

The invention relates to a method of coding and of decoding a digital data stream coded by spatio-temporal combinations, in multiple transmission and reception.

On transmission, the initial stream (IDS) is subjected to an outer coding (A), a blockwise interleaving (B), a demultiplexing (C) over a plurality of pathways, to an inner coding $\Xi_m$ on each pathway, then transmitted on a plurality (v) of distinct antennas forming a space-diversity array. On reception, the coded symbol streams transmitted are observed (F) by means of a number v of reception antennas which is independent of the number of transmission antennas, the observed coded symbol streams $$\{MSDS_r\}_{r=1}^{r=\rho}$$

are subjected to a process of turbo-detection by equalization and joint decoding (G), deinterleaving (H), outer decoding (I), interleaving (J), so as to generate an a priori information item (api) on the coded bits, which is reinjected (K) into the turbo-detection process.

Application to the implementation of a universal radiofrequency interface, in particular for mobile radio telephony.

12 Claims, 7 Drawing Sheets

U.S. PATENT DOCUMENTS

| | | | |
|---|---|---|---|
| 6,891,897 B1* | 5/2005 | Bevan et al. | 375/265 |
| 2003/0005388 A1* | 1/2003 | Fukumasa | 714/786 |
| 2003/0118122 A1* | 6/2003 | Nefedov | 375/265 |

OTHER PUBLICATIONS

Takeshi Hashimoto. "A list-type reduced-constraint generalization of the Viterbi algorithm"—IEEE Transactions on Information Theory. vol. IT-33, No. 6, Nov. 1987.

J.Hagenauer, P.Hoeher, "A Viterbi algorithm with soft decision outputs and its applications", Proc. IEEE GLOBECOM'89, pp. 1680-1686, Dallas, USA, Nov. 1989.

C.Berrou et al. "Near Shannon limit error correcting coding and decoding: Turbo-codes"—IEEE ICC'93, pp. 1064-1073, Geneva, Switzerland, May 1993.

C.Douillart et al. "Interactive correction of intersymbol interference: Turbo-equalization"—Europ. Trans. on Telecommunication, vol. 6, pp. 507-511, Sep. 1995.

S. Benedetto et al. "Serial Concatenation of interleaved Codes: Performances analysis, design and iterative decoding"—TDA Progress Report 42-126, Aug. 1996.

G.J. Foschini. "Layered space-time architecture for wireless communication in a fading environment when using multi-element antennas".. Bell Labs Journal. Autumn 1996.

ETSI.GSM Recommendations, 05.5 version 5.8.0—Dec. 1996.

V.Tarock et al. "Space time codes for high data rata wireless communication: performance criterion and code construction", IEEE Trans. Inform. Theory vol. 44, No. 2, Mar. 1998.

G.Bauch, V.Franz. "A comparison of soft-in soft-out algorithm for turbo-detection" Proceedings of ITC, vol. 2, pp. 259-263, Portos-Carras, Greece, Jun. 1998.

Bauch G. "Concatenation of space-time block codes and turbo-TCM"-ICC'99- 1999 IEEE International Conference on Comm. Conference Record. Vancouver, CA, Jun. 6-10, 1999—IEEE International Conference on Comm—New-York-vol. 2, Jun. 6, 1999—pp. 1202-1206, XP 000898047—ISBN 0-7803-5285-8.

Bauch et al. "MAP equalization of space-time coded signals over frequency selective channels"—Proc. Wireless Comm. on Networking Conference (WCNC) Sep. 1999.

G.J.Foschini et al. "Simplified processing for high spectral efficiency wireless communication employing multi-element arrays", IEEE JSAC, vol. 17, No. 11, pp. 1841-1852, Nov. 1999.

Stevanov et al. "Turbo coded modulation for systems with transmit and receive antenna diversity"—GLOBECOM'1999 IEEE Global Telecommunications Conference. Seamless interconnection for universal services. Rio de Janeiro, Brazil, Dec. 5-9, 1999 IEEE Global Telecommunications Conference N.Y.—vol. 5 (Dec. 5, 1999), pp. 2336-2340, XP000958539, ISBN 0-7803-5797-3.

R.Visoz et al. "Generalised Viterbi algorithm for trellis coded signals transmitted through broadband wireless channels"- Electronic Letters, pp. 227-228, Feb. 3, 2000, vol. 36, No. 3.

Bauch G. et Al-Dahir. "Iterative equalization and decoding with channel shortening filters for space-time coded modulation". Vehicular Technology Conference Fall 2000. IEEE VTS Falls VTC2000, vol. 4, Sep. 24-28, 2000, pp. 1575-1582, XP002180247, Boston MA, USA.

Leung Hang Ching Jason. "Low complexity turbo space-time code for system with large number of antennas" Proc. of Global Telecomm. Conf. GLOBECOM'2000, vol. 2, Nov. 27, 2000-Dec. 1, 2000, pp. 990-994, XP002180248, San Francisco CA, USA.

A.O. Berthet et al. "A comparison of several strategies for iteratively decoding serially concatenated convolution codes in multipath Rayleigh fading environment", Proc. IEEE GLOBECOM'2000,San Francisco, USA, Nov. 2000.

M.Pukkila "Turbo-Equalisation for the enhanced GPRS system"—Proc.IEEE Conf. PIMRCOO London UK, 2000.

French Search Report of Publication No. FR 0102343, report dated Oct. 16, 2001.

* cited by examiner

METHOD AND SYSTEM OF ITERATIVE CODING/DECODING OF DIGITAL DATA STREAMS CODED BY SPATIO-TEMPORAL COMBINATIONS, IN MULTIPLE TRANSMISSION AND RECEPTION

FIELD OF INVENTION

The invention relates, in general, to high or very high bit rate radiofrequency transmission systems, useable either within the framework of mobile telephony, or within the equally promising field of radiofrequency links between electronic apparatus, in any environment.

BACKGROUND OF THE INVENTION

In the aforementioned fields of application, the transmission of digital data with a high degree of reliability and security comes up against a major obstacle, that of the transmission of these data by way of a variable transmission channel whose characteristics are not known a priori. The digital data transmitted are subdivided into symbols, consisting of strings of bits of these data, each symbol allowing the modulation of a carrier radio wave transmitted over the channel.

The very strong demand for reliable high bit rate radiofrequency transmission processes has brought about the initiation and execution of numerous research projects relating to the definition and implementation of future-generation TDMA (Time Division Multiple Access) mobile radio communication systems.

Radiofrequency transmission channels are known by the fact that they are both frequency selective and time varying. The temporal variation is consequent upon the mobility or the speed of the user or users. Their frequency selectivity results from the conditions of propagation of the radiofrequency signals via multiple paths and the destructive superposition of the signals received, arising from propagations over these various paths. The phenomenon of frequency selectivity brings about a phenomenon of intersymbol interference, prejudicial to the quality of transmission and detection of these symbols upon reception thereof. The phenomenon of intersymbol interference and the complexity of the receivers are substantially heightened with the transmission bit rate.

These specific characteristics of the above-cited radiofrequency transmission channels have always led to the implementation of particularly subtle tailored radiofrequency interfacing systems, all the more so when high bit rate transmission with high spectral efficiency is sought.

Nevertheless, the aforesaid frequency selectivity and temporal variation, regarded a priori as major obstacles, of radiofrequency transmission channels have however been the subject hitherto of investigations, by way of the concept of diversity, as will be explained hereinbelow.

In this respect, the concept of turbo-code presented by C. BERROU, A. GLAVIEUX, P. THITIMAJSHIMA in the article entitled "*Near Shannon limit error correcting coding and decoding: Turbo Codes*", IEEE ICC'93, pp. 1064–1070 Geneva, Switzerland, May 1993, has rekindled interest in iterative processes both from the theoretical point of view and from the practical point of view.

The remarkable success of such a concept resides in three of its specific aspects: quasi-random nature, concatenation of several compounded codes of low complexity, and iterative decoding by weighted input/output of each constituent code, by virtue of the use of information available from all the other codes.

A generalization of these concepts has led to a novel approach, dubbed the principle of turbo-detection, within the field of communication theory, this approach consisting of a recursive updating of random a posteriori information on data or symbols from among the set of functions concatenated in the reception chain.

The turbo-detection process described in the article published by C. DOUILLART, M. JEZECHIEL, C. BERROU, A. PICART, P. DIDIER, A. GLAVIEUX and entitled "Interactive Correction of Intersymbol Interface: Turbo-Equalization" published in *European Trans. On Telecommunication*, Vol. 6, pp. 507–511, September 1995, would appear to be a highly beneficial application of the "turbo-detection principle" concept, aimed at reducing or inhibiting the intersymbol interference phenomena generated by a radiofrequency transmission channel.

By modelling the structure of intersymbol interference as a nonsystematic nonrecursive and time-varying convolutional code of unit rate, the detection of data and the decoding (equalization) of the transmission channel may be identified formally with a serial concatenation of two trellis codes. The maximum-likelihood optimal decoding of the set thus formed, conditioned upon the perfect knowledge of the transmission channel, can then be achieved by virtue of an iterative process similar to that described by S. BENEDETTO, D. DIVSALAR, C. MONTORSI, F. POLLARA, in the article entitled "*Serial Concatenation of Interleaved Codes: Performance Analysis, Design and Iterative Decoding*" and published by TDA Progress Report 42–126, August 1996.

Various fields exhibiting some interest have appeared in the wake of earlier studies relating to turbo-detection.

One of these fields relates to the estimation of a mismatched channel, such as described in the article by G. BAUCH, V. FRANZ, entitled "*A Comparison of Soft-in Soft-out Algorithm for Turbo-Detection*" and published by Proceedings of ICT, Vol. 2, pp. 259–263, Portos Carras, Greece, June 1998 and which has been at least partially solved through the implementation of a "fully turbo" receiver developed by A. O. BERTHET, B. SAYRAC ÜNAL, R. VISOZ. The basic concept consists in superimposing on the architecture of the turbo-detector an iterative process of channel reestimation, which exploits the information available on the symbols after channel decoding.

Another of these fields subjected to investigation consists in strengthening the inner code relating to the intersymbol interference phenomenon through the introduction of a trellis coded modulation (TCM), as has been proposed by R. VISOZ, P. TORTELIER and A. O. BERTHET in the article entitled "*Generalised Viterbi Algorithm for Trellis coded Signals transmitted through Broadband Wireless Channels*" published by Electronic Letters, pp. 227 to 228, 3 Feb. 2000, Vol. 36, No. 3 and by A. O. BERTHET, R. VISOZ, B. ÜNAL and P. TORTELIER in the article entitled "*A Comparison of Several Strategies for Iteratively Decoding Serially concatenated Convolutional Codes in Multipath Rayleigh Fading Environment*" published by Proc. IEEE GLOBECOM' 2000, San Francisco USA, November 2000. In the latter article, a serially concatenated TCM code scheme has turned out to provide at least two advantages according to which:

1. the decoding can begin sooner, by comparison with the conventional turbo-detection process, while the performance is asymptotically better;

2. the computational complexity can be reduced by carrying out a SISO detection of the data and a joint TCM decoding on the only reduced-state TCM trellis.

However, by its very nature the turbo-detection process fully utilizes the diversity introduced by the coding and the interleaving, and, consequently, its performance is strongly related to the depth of interleaving.

Although the process turns out to be efficient even with regard to the worse configurations of static intersymbol interference, it cannot be specially tailored to specific radiofrequency profiles, cf. ETSI.GSM Recommendations, 05.05 version 5.8.0 December 1996, where most of the outputs of the channel are in general easy to equalize but characterized by deep frequency fading.

When the transmission channel disturbance generated by the variation in the temporal distribution of energy supplants the frequency-selective dispersion, the turbo-detection process remains ineffectual, in particular in the case of delay-sensitive applications. Cf. the article by M. PUKKILA "*Turbo Equalisation for the Enhanced GPRS System*" published by IEEE conf. PIMRCOO London, UK, 2000. This is why, with the aim of achieving the best possible performance, advanced TDMA mobile systems must be designed both to combat the phenomenon of intersymbol interference and to cater for other forms of diversity, that is to say antenna spatial diversity.

To benefit from the phenomenon of spatial diversity, by virtue of the spatio-temporal coding techniques, as described by V. TAROCK, N. SESHADRI, A. R. CALDERBANK in the article entitled "*Space Time Codes for High Data Rata Wireless Communication: Performance Criterion and Code Construction*" published by IEEE Trans. Inform. Theory. Vol.44, No. 2, March 1998, while implementing turbo-detection, the basic communication model proposed implements an outer code, essential for the turbo-detection process, interleaved with a spatio-temporal trellis coded modulation (ST-TCM).

In fact, such a model must be regarded as a serially concatenated spatio-temporal trellis coded modulation. It makes it possible to maintain the essential advantage consisting in allowing joint equalization and inner spatio-temporal decoding by virtue of sub-optimal SISO algorithms of reduced complexity, contrary to the distinct more complex approach, described by C. BAUCH, A. NAGUILS, N. SESHADRI in the article entitled "*PA Equalisation of Space-Time Coded Signals over Frequency Selective Channels*" published by Proc. Wireless Communications on Arraying Conference (WCNC) September 1999, according to which approach the data detection and the spatio-temporal decoding are carried out separately in an iterative manner.

Finally, various projects aimed at affording a significant improvement to the spectral efficiency of codes of the serially concatenated spatio-temporal trellis coded modulation type, hereinbelow designated serially concatenated ST-TCM codes, have been published.

To the knowledge of the inventors, there are at most four distinct approaches which can allow an improvement in the spectral efficiency of serially concatenated ST-TCM codes:

A first possibility consists in reducing the coding rate to the maximum, both of the inner code and of the outer code.

Unfortunately, a consequence of reducing the coding bit rate of this outer code is poor performance of the turbo-detection.

A second possibility consists in increasing the order of modulation of the serially concatenated ST-TCM code.

Such an increase, however, beyond an order 4, through the implementation of better configurations of the best known ST-TCM codes, such as those described by V. TAROCK, N. SESHADRI, A. R. CALDERBANK in the above-cited article, results in a very great reduction in the performance of the inner code, which code reduces to a combination of the ST-TCM code and of the channel code.

By reason of the fact, however, that the serially concatenated TCM code schemes consisting of simple QPSK modulations coded by a convolutional code of rate ½ have proved to be very efficient within the framework of numerous intersymbol interference environments, as described by A. O. BERTHET, R. VISOZ, B. ÜNAL and P. TORTELIER in the article entitled "*A comparison of Several Strategies for Iteratively Decoding Serially Concatenated Convolutional Codes in Multipath Rayleigh Fading Environment*" cited above, the third possibility consists in multiplying the digital data of several users, or equivalently, various distinct data streams, in the same time interval of the TDMA system. Such an approach makes it possible to increase the overall spectral efficiency of the system. Within the framework of this third possibility, a first implementation can consist in modelling a multi-user communication by multiplexing several fully independent serially concatenated ST-TCM coding processes and by regarding each distinct input data stream as a specific user. Such an implementation does not however utilize the phenomenon of spatial diversity.

A fourth approach consists finally in demultiplexing a single pre-encoded data stream on a plurality of transmission antennas, in accordance with the BLAST process (Bell Labs Layered Space-Time) as described by G. J. FOSHINI, G. D. GOLDEM, R. A. VALENZUELA, P.W. WOLANIANSKY, in the article entitled "*Simplified processing for High Spectral Efficiency Wireless Communication Employing Multi-element Arrays*" published by IEEE JSAC, Vol. 17, No. 11, pp. 1841–1852, November 1999.

In the last two approaches, the radiofrequency interface thus described is in particular based on the use of several antennas in transmission and in reception and relies, in order to attain very high bit rates and high spectral efficiency, on the parallel transmission of several data streams coded by a spatio-temporal code, STC code, corresponding substantially to an ST-TCM code.

In particular, the technique allowing the implementation of the aforesaid radiofrequency interface exhibits the major drawback of not supporting intersymbol interference, by reason of the use of a suboptimal linear receiver whose performance is therefore, in the absence of coding, related directly to the rank of the transfer matrix representative of the transmission channel, the phenomenon of spatial diversity on transmission and on reception was alone taken into account.

Furthermore, owing to the linear processing alone introduced, the number of antennas in reception cannot be less than the number of antennas in transmission, the number of antennas in reception even having to be increased, in relation to the number of antennas in transmission, so as to try to improve the performance and the level of quality of detection and of reception although the test transmission channel was a channel devoid of intersymbol interference. In conclusion, the performance of such a radiofrequency interface remains tightly related to the propagation conditions existing on the transmission channel and direct application of such a radiofrequency interface to mobile radio telephony cannot readily be envisaged, since mobile radio telephony receivers, by reason of their size and their reduced bulk, scarcely admit a number of transmission/reception antennas greater than two.

SUMMARY OF THE INVENTION

The object of the present invention is to remedy all the drawbacks of the various approaches for radiofrequency interface implementation of the prior art, and, in particular, to circumvent the limiting constraints of the transmission bit rate and also the constraints related to the respective number of antennas in transmission and in reception, while taking into account the phenomenon of spatial and/or temporal diversity in transmission and in reception.

In particular, an object of the present invention is the implementation of a method and a system of coding, respectively of iterative decoding of digital data streams coded by spatio-temporal combinations, in the presence of intersymbol interference, in multiple transmission and reception, capable of allowing the transmission and decoding of symbols in any environment, generating a severe phenomenon of intersymbol interference.

Another object of the present invention is also the implementation of the aforesaid methods and systems making it possible, by virtue of their noteworthy processing performance in dealing with the phenomenon of intersymbol interference, to attain very high bit rate levels capable of coping with the demand of all the TDMA systems of future generations.

Another object of the present invention is the implementation of the aforesaid methods and systems, allowing the definition and production of high spectral efficiency radiofrequency interfaces and making it possible to attain very high bit rates, despite the presence of the intersymbol interference phenomenon, these universal type interfaces being implementable in the most varied applications.

Another object of the present invention is, consequently, the implementation of a radiofrequency interface, implementing a turbo-detection process, in which the inner code making it possible to equalize the transmission channel is strengthened by the introduction of a trellis coded modulation, TCM code, the trellis of the resulting inner code being reducible to a combination of the TCM code and of the transmission channel, the process of equalization and of decoding of the resulting trellis, when the latter is reduced, being reduced to a sub-optimal joint equalization and decoding process.

Another object of the present invention is, consequently, the implementation of a radiofrequency interface in which, on the one hand, the turbo-detection process implemented makes it possible to deal with the intersymbol interference phenomenon generated by the memory effect of the transmission channel, and, on the other hand, the frequency fading phenomenon related to the variation in the distribution of the radiofrequency energy in the transmission channel is dealt with, by virtue of the implementation of the phenomenon of spatial diversity in transmission and in reception.

Another object of the present invention is, furthermore, despite the spatial diversity phenomenon introduced, in particular in transmission, the implementation of a radiofrequency interface in which the complexity of the constituent receiver of this interface is reduced and where, furthermore, the number of reception antennas is independent of the number of transmission antennas.

Another object of the present invention is finally the implementation of a radiofrequency interface in which, at the receiver level, the turbo-detection process implemented calls upon the soft input/output generalized Viterbi algorithm, this making it possible to execute the equalization and decoding operations on trellises which are much reduced in complexity, and correspondingly to reduce the computational complexity of this receiver, while retaining similar equalization and decoding performance to an optimal equalization and decoding process.

The method and the system for coding a digital data stream coded by spatio-temporal combinations in multiple transmission and reception, which are the subjects of the present invention, consists in, respectively entails subjecting the initial digital data stream to an outer coding by means of a first code of specified rate, so as to generate a coded digital stream, subdivided into successive blocks, subjecting this coded digital stream to a blockwise interleaving process so as to generate an interleaved coded digital stream exhibiting temporal diversity, subjecting this coded and interleaved digital stream to a demultiplexing, this coded and interleaved digital stream thus being subdivided into a number v of elementary interleaved coded digital streams, subjecting each elementary interleaved coded digital stream to an inner coding by means of at least one second code of specified rate, so as to generate a set of elementary digital streams coded by spatio-temporal combinations, transmitting each elementary digital stream subdivided into symbols over a transmission channel by means of a distinct transmission antenna, the set of these transmission antennas forming a space-diversity array, so as to generate a set of transmitted elementary digital streams exhibiting spatial and temporal diversity. This makes it possible, on reception, to perform a decoding of the digital data stream coded by spatio-temporal combinations and consisting of the set of transmitted elementary digital streams, from a priori information representative of the spatial and temporal diversity.

The method and the system for decoding a digital data stream coded by spatio-temporal combinations in multiple transmission and reception, in accordance with the method cited above, which are the subjects of the present invention, are applied to a set of digital streams transmitted after coding according to this method. The method and the system for decoding according to the invention consist in, respectively entail receiving the digital data stream coded by spatio-temporal combinations and consisting of the set of digital streams transmitted over a transmission channel on a plurality of reception antennas, the number of these reception antennas possibly being less than or equal to the number v of multiplexing pathways and of transmission antennas forming an array of space-diversity reception antennas, so as to generate a set of elementary streams of modulation symbols received, subjecting this set of elementary streams of modulation symbols received to an iterative process of equalization of the transmission channel and of joint decoding, by means of the second inner coding on the basis of an extrinsic information stream on the bits coded by the first outer code and interleaved this extrinsic information stream on the bits coded by the first outer code and interleaved constituting an a priori information item emanating from a decoding on the basis of this first outer code, so as to generate a first extrinsic information stream on the bits coded by the first outer code and interleaved, subjecting this first extrinsic information stream to a deinterleaving, so as to generate a second extrinsic information stream on the coded bits originating from the equalization and joint decoding process, subjecting this second extrinsic information stream on the coded bits to a decoding on the basis of the first outer code, so as to generate a third extrinsic information stream on the coded bits, emanating from the decoding on the basis of the first outer code, subjecting this third extrinsic information stream to an interleaving, so as to generate the extrinsic information stream on the bits coded by the first outer code and interleaved, constituting the a priori information item, reinjecting this a priori information item into the iterative process for equalization of the transmission channel and joint decoding.

The method and the system of coding/decoding, which are the subjects of the present invention, find application in the implementation of radiofrequency interfaces in all fields, such as, in particular, very high bit rate mobile radio telephony, the wireless linking of electronic kit for installations in a domestic or industrial environment.

BRIEF DESCRIPTION OF THE DRAWINGS

They will be better understood on reading the following description and on looking at the drawings in which:

FIG. 2b represents, by way of illustration, a detail of carrying out an iterative process of equalization and joint decoding with soft input/output implemented within the framework of the decoding method which is the subject of the invention as represented in FIG. 2a;

MORE DETAILED DESCRIPTION

A more detailed description of the method of coding digital data streams coded by spatio-temporal combinations in multiple transmission and reception, in accordance with the subject of the present invention, will now be given in conjunction with FIG. 1a.

With reference to the aforesaid figure, it is indicated that the method of coding which is the subject of the present invention is applied to an initial data stream, denoted IDS, constituting a sequence of external data denoted $\{\underline{d}_1, \ldots \underline{d}_{r0}\}$, this sequence of external data corresponding to symbols consisting of successive bits, denoted $\underline{d}_n = \{d_{n,1}, \ldots d_{n,k0}\}$.

It is recalled that for the transmission of coded digital data, subdivision of these digital data into symbols consisting of a certain specified number of successive bits makes it possible to ensure channel modulation with a view to the transmission of these symbols and, ultimately, of the data sequence consisting of these symbols independently of any significant value of the sequence consisting of this sequence.

Figure 1A:
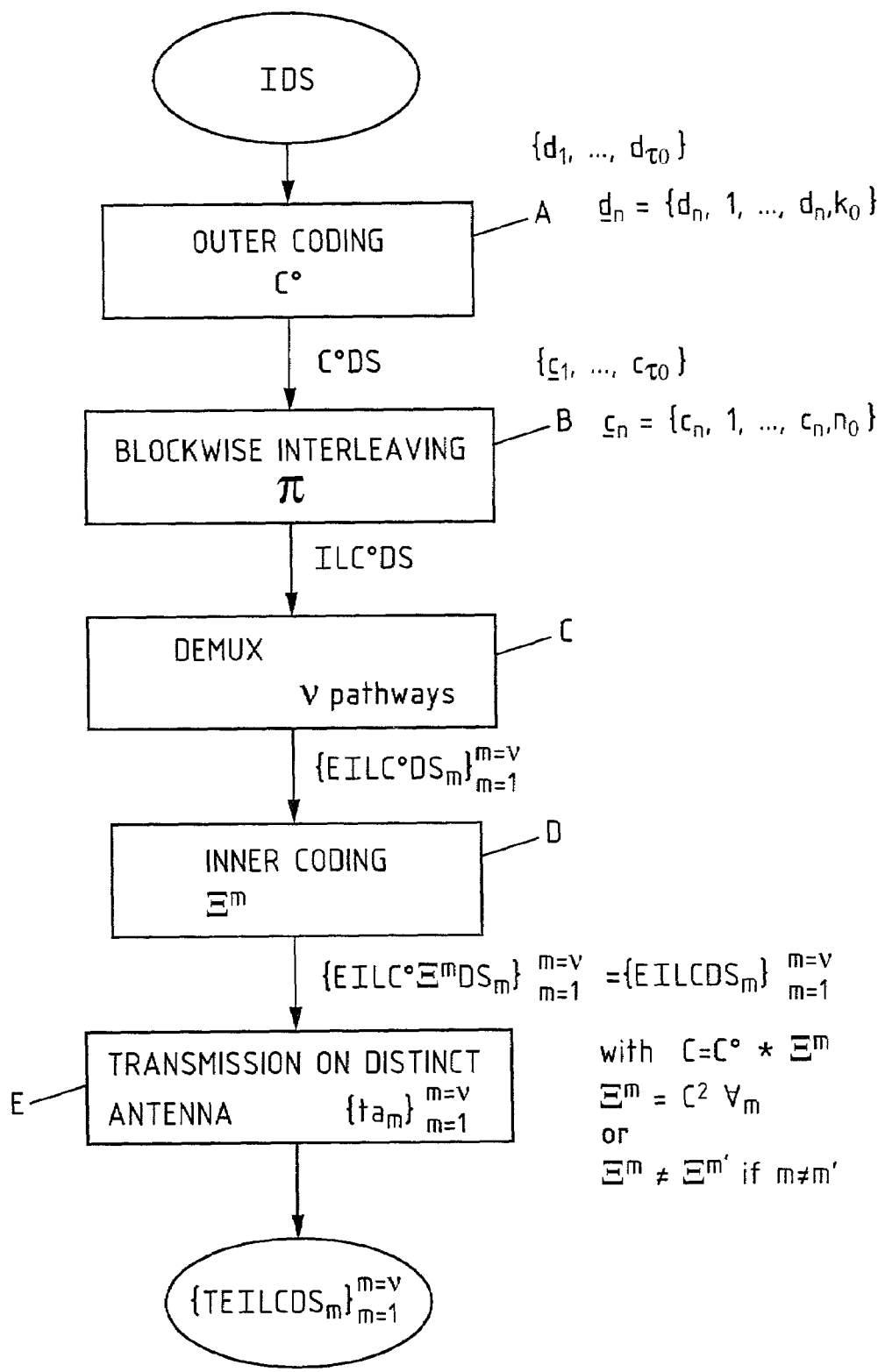
FIG. 1a represents, by way of illustration, a flowchart of the method of coding digital data streams coded by spatio-temporal combinations, in multiple transmission and reception, in accordance with the subject of the present invention.

As will be observed in FIG. 1a, the initial digital data stream IDS is subjected, in a step A, to an outer coding by means of a first code of specified rate so as to generate a coded digital stream. In the aforesaid FIG. 1a, the first code making it possible to perform the outer coding is denoted $C^0$.

More specifically, it is indicated that the first outer code may advantageously consist of a trellis code or, equivalently, of a combination of trellis codes. The coded digital stream obtained following step A is denoted $C^0DS$ in FIG. 1a. It consists of an outer coded sequence, denoted $\{\underline{c}_1, \ldots, \underline{c}_{r0}\}$, this outer coded sequence consisting of coded bit symbols denoted $\underline{c}_n = \{c_{n,1}, \ldots c_{n,n0}\}$ where $c_{n,1}$ to $c_{n,n0}$ denote the successive constituent bits of the coded symbol $\underline{c}_n$.

The coded digital stream $C^0DS$ is then subjected to a step B, after a subdivision into successive blocks for example, to a blockwise interleaving process so as to generate an interleaved coded digital stream, denoted $ILC^0DS$, thus exhibiting, owing, on the one hand, to the outer coding in step A and to the interleaving, on the other hand, temporal diversity.

In a general manner, it is indicated that the blockwise interleaving process in step B can be implemented by means of a random interleaver system denoted π.

Step B is itself followed by a step C consisting in subjecting the coded and interleaved digital stream $ILC^0DS$ to a demultiplexing, the coded and interleaved digital stream $ILC^0DS$ being subdivided by this operation into a given number ν of elementary interleaved coded digital streams, the set of these elementary interleaved coded digital streams being denoted in FIG. 1a:

$$\{EILC^0DS_m\}_{m=1}^{m=\nu}$$

It is appreciated that each elementary interleaved digital stream in fact consists of a layer of rank m, which layer, in accordance with the coding method which is the subject of the present invention, in addition to the quality of temporal diversity introduced owing to the outer coding and to the interleaving, makes it possible, as will be described later in the description, to introduce a specific spatial coding.

The aforesaid step C is then followed by a step D consisting in subjecting each elementary interleaved coded digital stream, that is to say each signal at the level of each layer of rank m∈[1,ν] to an inner coding process by means of at least one second code denoted $\Xi^m$ of specified rate, so as to generate a set of elementary digital streams coded by spatio-temporal combination. Following the aforesaid step D, the set of elementary streams coded by spatio-temporal combination is denoted:

$$\{EILC^0 \Xi^m DS_m\}_{m=1}^{m=v}.$$

The expression for the set of elementary digital streams coded by spatio-temporal combination is simplified according to the relation:

$$\{EILCDS_m\}_{m=1}^{m=v} \text{ with } C = C^0 * \Xi^m$$

The sign * designating the combination of the outer code and of the inner coding applied to each of the elementary interleaved coded digital streams, that is to say to each of the digital signals transmitted by each layer of rank m, having regard of course to the interleaving operation carried out in step B. This combination can be analysed as a product of the outer code and of the inner coding, as will be described hereinbelow.

At the end of the inner coding step D, we have a set of elementary digital streams coded by spatio-temporal combinations owing to the subdivision into layers of rank m and of the specific inner coding combined with the aforesaid outer coding.

Step D is itself followed by step E consisting in transmitting each aforementioned elementary digital stream consisting of symbols $EILCDS_m$ over a transmission channel by means of a distinct transmission antenna.

In accordance with a noteworthy aspect of the method which is the subject of the present invention, the set of distinct transmission antennas, denoted $$\{ta_m\}_{m=1}^{m=v}$$

forms a space-diversity array and consequently makes it possible to generate, from each elementary digital stream coded by spatio-temporal combination $EILCDS_m$, a set of transmitted elementary digital streams exhibiting spatial and temporal diversity, by reason, on the one hand, of the outer codings and inner codings introduced having regard to the blockwise interleaving, and to the apportioning of the transmission over the set of distinct transmission antennas, on the other hand.

As far as the latter is concerned, it is indicated that this set of transmission antennas forms a space-diversity array, each distinct constituent transmission antenna of this array being distanced from a neighbouring distinct transmission antenna by a distance greater than $\lambda_0$, where $\lambda_0$ designates the wavelength of the carrier wave making it possible to ensure the transmission by modulation of each of the elementary digital streams coded by spatio-temporal combinations and obtained on completion of step D.

The coding method which is the subject of the present invention makes it possible, on reception, to perform a decoding of the digital data stream coded by spatio-temporal combinations constituting the set of elementary digital streams transmitted from a priori information items representative of the spatial and temporal diversity introduced into the coding.

Various elements for implementing steps C, D of the method which is the subject of the present invention illustrated in FIG. 1a will now be given hereinbelow.

Preferably, it is indicated that, for each layer of rank $m \in [1, v]$, each elementary interleaved coded digital stream consists of a frame, which is in turn divided into N bursts each including τ successive symbols, denoted $$\{\underline{u}_1^m, \ldots \underline{u}_\tau^m\},$$

each symbol consisting of a succession of coded bits, denoted $$\underline{u}_n^m = \{u_{n,1}^m, \ldots, u_{n,km}^m\},$$

these symbols being supplemented, in a conventional manner known per se, with tail bits, and, after inner coding, a known sequence constituting a learning sequence, in general of CAZAC type symbols. It is recalled that the aforesaid learning symbols, known per se, make it possible, after transmission, to perform a prior evaluation of the impulse response of the transmission channel, the transmission channel consisting of a plurality of propagation paths between the transmitter and the receiver, each path constituting an elementary transmission channel.

Thus, following step C, each constituent burst of the elementary interleaved coded digital streams of successive rank m is subjected to the coding $\Xi^m$, which makes it possible to associate with each of the input symbols $$\underline{u}_n^m$$

a coded symbol, formed by a succession of bits and denoted $$\underline{x}_n^m = \{x_{n,1}^m, \ldots, x_{n,n(m)}^m\}.$$

The aforesaid coded symbols $\underline{x}_n^m$ are then apportioned in groups of $$q_t^m$$

bits over the $\eta_m$ distinct transmission branches, so that, at each given instant, relation (1) is satisfied:

$$n(m) = \sum_{t=1}^{\eta_m} q_t^m \tag{1}$$

It is recalled that m designates the rank of the layer, with $1 \leq m \leq v$ and t designates the rank of the transmission antenna associated with the inner coding $\Xi^m$ of layer m, with $1 \leq t \leq \eta_m$, the number of antennas $\eta_m$ per layer depending on the rank of the layer and hence on the coding $\Xi^m$.

Assuming a modulation family of the type $$Q_t^m = 2^{q_t^m},$$

ary, with $$q_t^m$$

each group of $$Q_t^m-$$

bits on each transmission branch $t \in [1, \eta_m]$ is subjected to a $$Q_t^m-$$

ary modulation producing a complex symbol denoted $$z_n^{m,t}.$$

In the case of the most general implementation of the coding method which is the subject of the present invention, it is indicated that each inner coding implemented on the basis of the second code $\Xi^m$ may differ as a function of the rank m of each layer.

In such a situation, this diversity of the inner coding is denoted:

$$\Xi^m \neq \Xi^{m'} \text{ if } m \neq m'.$$

Conversely, and in a nonlimiting particular embodiment, it is indicated that each second inner coding $\Xi^m$ can be identical for each layer of rank m, this condition being denoted:

$$\Xi^m = C^2 \forall m$$

in FIG. 1a.

Generally, it is indicated that the transmission channel, for a number $$\eta = \sum_{m=1}^{\nu} \eta_m$$

of transmission antennas and for $\rho$ reception antennas, consists of the set of multiple paths relaying each transmission antenna to a reception antenna.

Under these conditions, and by reason of the multipath propagation and of the variable nature of the transmission channel by reason of the mobility between the transmitter and receiver, a time-varying frequency-selective radiofrequency channel can be modelled by the discrete-time impulse response of the equivalent channel, including of course the transmission and reception shaping filters used customarily, each corresponding elementary transmission channel being for this reason denoted:

$$\underline{h}^{m,t,r} = \{h_0^{m,t,r}, \ldots, h_{\chi_c-1}^{m,t,r}\} \quad (5)$$

for each path linking a transmission antenna of each layer m to a reception antenna of given rank r.

In the above relation, $\chi_c$ designates the constraint length in terms of number of symbols transmitted, the constraint length being representative of the memory of the channel.

All the elementary channels are regarded as exhibiting the same constraint length $\chi_c$. Such an assumption is admissible since the number of components of individual multiple paths is essentially determined by broad structures and reflecting objects.

If, in accordance with the method which is the subject of the present invention, burst-by-burst transmission is taken into consideration, then, the elementary transmission channels and the resulting transmission channel are static throughout the duration of transmission of a burst and change independently from one burst to another. Under these conditions, the value $\tau$ can be regarded, to a first approximation, as a measure of the coherence time of the aforesaid channel. These conditions make it possible to establish an acceptable modelling for the multipath quasi-static channels with slowly varying frequency fading and frequency hopping.

The coefficients, denoted $$\{h_k^{m,t,r}\}_k$$

of each elementary channel can, in this case, be regarded as independent gaussian complex random variables, with the same zero mean energy, satisfying relation (2):

$$\sum_{k=0}^{\chi_c-1} \|h_k^{m,t,r}\|^2 = 1 \quad (2)$$

At each discrete sampling time n, each reception antenna of rank r observes, under these conditions, a set of transmitted symbols corresponding to the transmitted elementary digital stream $$\{TEILCDS_m\}_{m=1}^{m=\nu}$$

and satisfying relation (3):

$$y_n^r = \sum_{m=1}^{\nu} \sum_{t=1}^{\eta_m} \sum_{k=0}^{\chi_c-1} h_k^{m,t,r} z_{n-k}^{m,t} + \varsigma_n^r \quad (3)$$

In this relation $\varsigma_n^r$ represents a complex noise sample with zero mean value and with variance $2\sigma^2$.

Figure 1B:
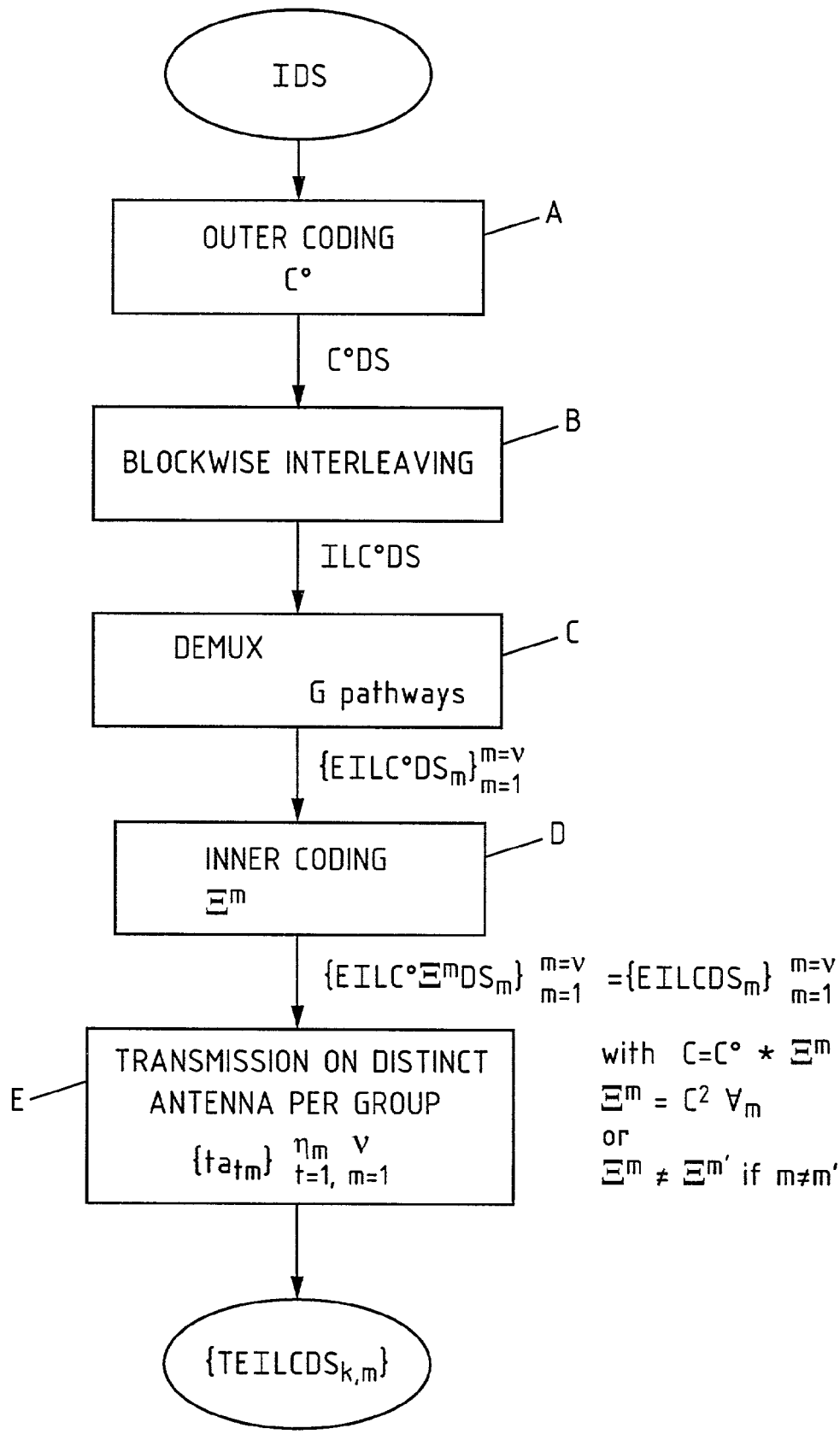
FIG. 1b represents, by way of illustration, a flowchart of the method of coding digital data streams coded by spatio-temporal combinations, in multiple transmission and reception, in accordance with the subject of the present invention, in which the transmission antennas are grouped into specific antenna groups.

Represented in FIG. 1b is a variant implementation of the coding method which is the subject of the present invention in which steps A, B, C and D are identical but where, however, the number of multiplexing pathways and the number of distinct transmission antennas are different.

In this mode of implementation, the transmission antennas are grouped into groups of transmission antennas, each antenna group, denoted $$\{ta_{tm}\}_{t=1,m=1}^{\eta_m,\ v}.$$

Thus, each elementary digital stream coded by spatio-temporal combination arising from step D, denoted EIL-CDS$_m$, is transmitted to each group of antennas, each group of distinct transmission antennas for each of the codes of the spatio-temporal trellis coded modulation type $\Xi^m$ forming a sub-array of space-diversity antennas, the distance between each antenna of each group being less than $\lambda_0$, $\lambda_0$ designating the wavelength of the carrier wave.

In the same way as in the case of FIG. 1a, the second inner coding $\Xi^m$ can be unique for each of the groups, this relation being denoted $\Xi^m = C^2 \forall m$, or distinct for each of the groups and, ultimately, for each of the layers of rank m, the various inner codings implemented then being denoted $\Xi^m \neq \Xi^{m'}$ if $m \neq m'$.

A method of decoding a digital data stream coded by spatio-temporal combinations in multiple transmission and reception, the coding of this digital stream having been performed in accordance with the coding method which is the subject of the present invention as described in conjunction with the aforesaid FIGS. 1a and 1b, will now be described in conjunction with FIGS. 2a, 2b and 2c.

By reason of the coding of these digital data in accordance with the method which is the subject of the present invention described above, it is indicated that the decoding method which is the subject of the present invention, consists, in a step F, in receiving the digital data stream coded by spatio-temporal combinations and consisting of the set of elementary digital streams transmitted over a transmission channel, this set of transmitted elementary digital streams being denoted $$\{TEILCDS_m\}_{m=1}^{m=v},$$

this reception being performed on a plurality p of reception antennas. In FIG. 2a, the set of reception antennas is denoted $$\{ra_r\}_{r=1}^{r=\rho}.$$

Figure 2A:
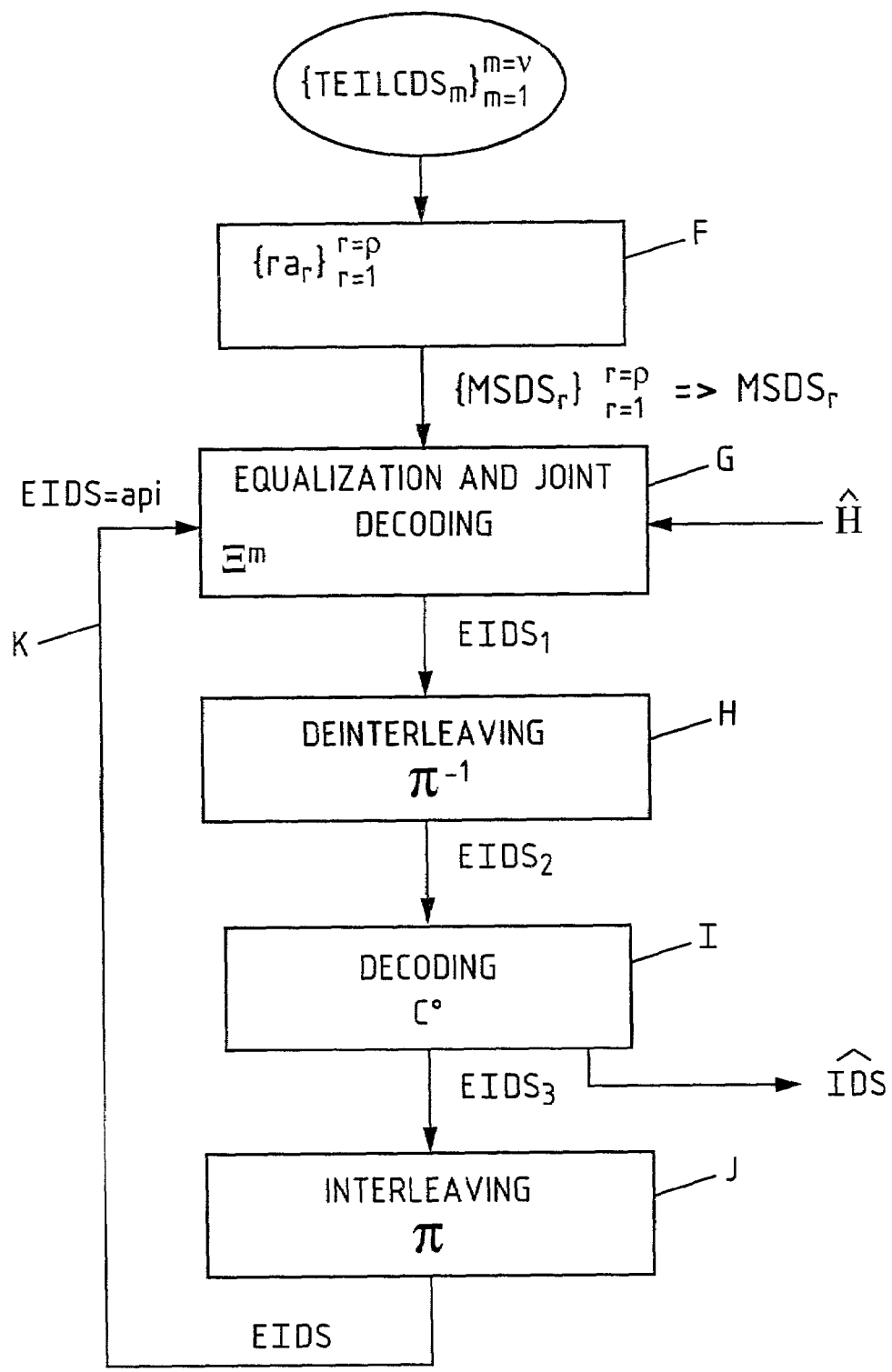
FIG. 2a represents, by way of illustration, a flowchart of the method of coding digital data streams coded by spatio-temporal combinations, in multiple transmission and reception, in accordance with the coding method illustrated in FIG. 1a or 1b.

These reception antennas, the number of which is independent of the number of transmission antennas, may be fewer than $\eta$ in number or equal to the number $\eta$ of transmission antennas and form, in accordance with an advantageous aspect of the decoding method, which is the subject of the present invention, an array of space-diversity reception antennas, so as to define a set of elementary streams of modulation symbols received, this set of elementary streams of modulation symbols received being denoted, on completion of step F of FIG. 2a, $$\{MSDS_r\}_{r=1}^{r=\rho}.$$

It is understood in particular that each modulation symbol received is a symbol of the form $y_n^r$ satisfying relation (3) mentioned previously in the description.

Step F is then followed by step G consisting in subjecting the set of elementary streams of modulation symbols received $$\{MSDS_r\}_{r=1}^{r=\rho}$$

to an iterative process of equalization of the transmission channel and of joint decoding by means of said second inner coding $\Xi^m$ on the basis of a stream of extrinsic information on the bits coded by the first outer code and interleaved, this extrinsic information stream arising from a decoding on the basis of the first outer code. In FIG. 2a, the stream of extrinsic information on the bits coded by the first outer code and interleaved is denoted EIDS=api. Specifically, this information stream constitutes an a priori information item on the coded bits and the equalization and joint decoding process, implemented in step G on the basis of the second outer coding $\Xi^m$, makes it possible to generate a first extrinsic information stream on the bits coded by the first outer code and interleaved, this first extrinsic information stream being denoted EIDS$_1$ in FIG. 2a.

The aforesaid step G is followed by a step H consisting in subjecting the first extrinsic information stream EIDS$_1$ to a deinterleaving, so as to generate a second extrinsic information stream on the coded bits originating from the equalization and joint decoding process, this second extrinsic information stream being denoted EIDS$_2$ in FIG. 2a. The deinterleaving operation is the operation inverse to the interleaving operation carried out during the implementation of the coding method, which is the subject of the present invention, this deinterleaving process being denoted, for this reason, $\pi^{-1}$ in FIG. 2a.

The second extrinsic information stream on the coded bits EIDS$_2$ is then subjected, in step I, to a decoding on the basis of the first outer code $C^0$ so as to generate a third extrinsic information stream on the coded bits, denoted EIDS$_3$, which arises from the decoding on the basis of the first outer code $C^0$. It is noted that, during this operation I, the decoding furthermore provides an estimate of the value of the initial digital signal, denoted for this reason $\hat{IDS}$.

Following step I, the third extrinsic information stream is subjected to an interleaving operation in step J so as to generate the extrinsic information stream on the bits coded by the first outer code and interleaved EIDS constituting the a priori information item on the coded bits, and denoted api. This a priori information item is then reinjected in step K, symbolized by the return loop, into the iterative process of equalization of the transmission channel and joint decoding, that is to say in step G of FIG. 2a.

With reference to FIG. 2a, it is understood in particular that the decoding method, which is the subject of the present invention, consists essentially in performing a multilayer joint detection of the coded data and a spatio-temporal inner decoding, this equalization and this joint decoding being associated iteratively with the outer decoding by means of the first code $C^0$ so as to benefit from the a priori information item on the coded bits api which arises from the successive implementation of steps G, H, I and J. It is understood in particular that the extrinsic information stream on the bits coded by the first outer code and interleaved, the stream denoted EIDS in FIG. 2a, and constituting the a priori information item on the coded bits api, is an information item relating to each constituent bit of the symbols $z_n^{m,t}$ constituting the signal received on completion of step F. Thus, this a priori information item constitutes effective information as to the value of the constituent bits of the aforesaid symbols and, ultimately, of the spatial and temporal diversity introduced by the coding and transmission process in accordance with the subject of the present invention.

A more detailed description of a particular mode of implementing the decoding method which is the subject of the present invention will now be given in conjunction with FIGS. 2b and 2c.

In the aforesaid specific embodiment, it is indicated that the latter corresponds to the implementation of a weighted input and output equalization and decoding process of the so-called SISO type (soft input soft output).

Under these conditions, the a priori information item reinjected into the equalization and joint decoding process of SISO type consists, advantageously, of a logarithmic value of the a priori probability ratio of the value of the coded bits, this logarithmic value constituting the extrinsic information on the bits coded by the first outer code and interleaved.

Figure 2B:
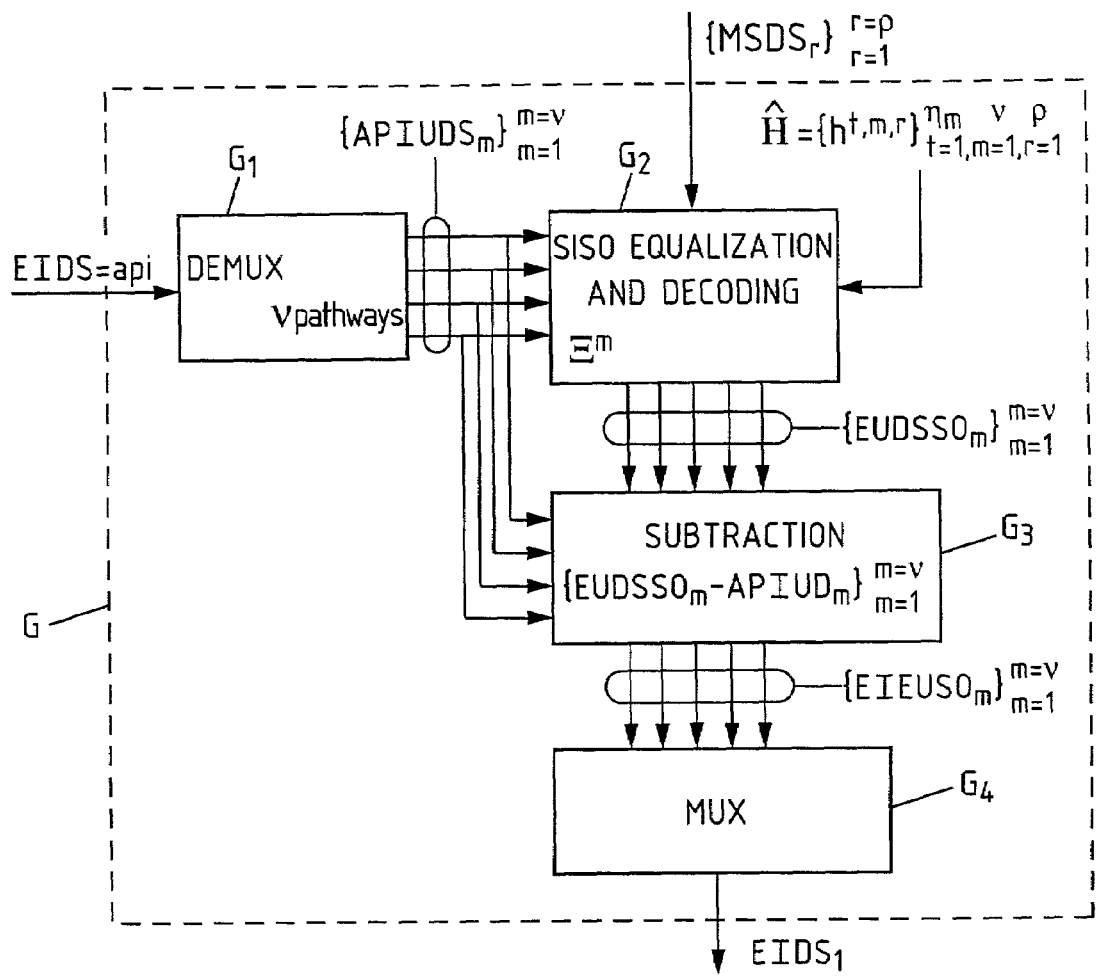

As represented in FIG. 2b, and for a second inner coding $\Xi^m$ of the spatio-temporal trellis coded modulation type, the equalization and joint decoding process G consists in demultiplexing, in a step $G_1$, the extrinsic information stream on the bits coded by the first outer code and interleaved EIDS constituting the a priori information item api as a set of streams of a priori information on the bits of user frames subdivided into packets, this set of streams of a priori information items on the bits of user frames being denoted $$\{APIUDS_m\}_{m=1}^{m=v}$$

in FIG. 2b.

Step $G_1$ is then followed by a step $G_2$ consisting in performing an equalization and a joint decoding with soft input/output, that is to say of SISO type, applied to a trellis with a reduced number of states by means of the second coding $\Xi^m$. This trellis is defined as the product of the combined trellises of the spatio-temporal trellis coded modulations and of the elementary-memory channels referring thereto, themselves having a reduced number of states, so as to generate a stream of weighted outputs on the bits of the user frames, this stream of weighted outputs on the bits of the user frames being denoted $$\{EUDSSO_m\}_{m=1}^{m=v}.$$

Step $G_2$ is followed by a step $G_3$ consisting in extracting from each stream of weighted outputs on the bits of the user frames $$\{EUDSSO_m\}_{m=1}^{m=v}$$

the a priori information item on the bits of the corresponding user frames $$\{APIDUS_m\}_{m=1}^{m=v}$$

so as to generate an extrinsic information stream, denoted $$\{EIEUSO_m\}_{m=1}^{m=v}.$$

on the bits of the user frames.

When the equalization and decoding process implemented in step $G_2$ is an equalization and decoding process of SISO type and when the inputs and outputs consisting of the a priori information item on the bits of the user frames $$\{APIDUS_m\}_{m=1}^{m=v},$$

respectively of the streams of weighted outputs on the bits of the user frames $$\{EUDSSO_m\}_{m=1}^{m=v}$$

are logarithmic probability values, the extraction process can be implemented, by reason of the logarithmic nature of this input/output information, by a subtraction, such as represented in step $G_3$ of FIG. 2b.

This subtraction is denoted:

$$\{EUDSSO_m - APIUD_m\}_{m=1}^{m=v}.$$

It is thus noted that, on the one hand, the equalization and joint decoding process is performed for each layer of rank m and that, on the other hand, the extraction process, and in particular the subtraction process in the case of the implementation of an equalization and joint decoding of SISO type, is also performed for each layer of rank m.

Following step $G_3$, the extrinsic information streams on the bits of the user frames $$\{EIEUSO_m\}_{m=1}^{m=v}$$

are subjected to a multiplexing operation $G_4$, so as to generate the first extrinsic information stream on the bits coded by the first outer code and interleaved, that is to say the stream $EIDS_1$.

Figure 2C:
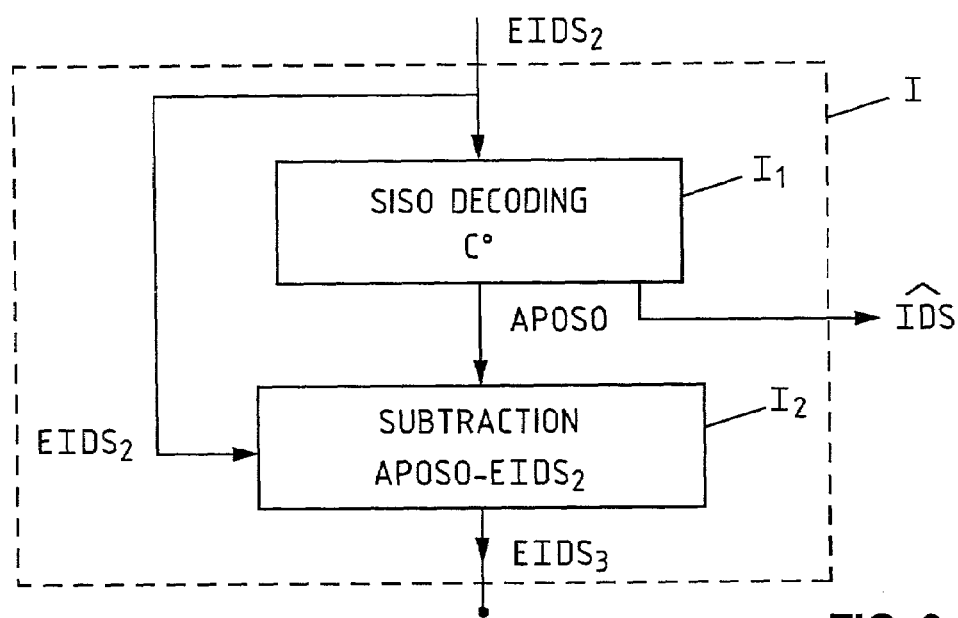
FIG. 2c represents, by way of illustration, a detail of the implementation of a soft input/output decoding process, on the basis of an outer code, making it possible to obtain a stream of extrinsic information on the coded bits, emanating from the decoding on the basis of a first outer code.

In the same way, as represented in FIG. 2c, and when the equalization and joint decoding process implemented in step $G_2$ of FIG. 2b is of SISO type, the step of decoding by means of the first outer code in step I of FIG. 2a can consist advantageously in subjecting, in a step $I_1$, the second extrinsic information stream on the coded bits originating from the equalization and joint decoding process, the extrinsic information stream denoted $EIDS_2$, to a weighted input/output decoding of SISO type by means of the first outer code $C^0$, so as to generate a weighted-output stream, denoted APOSO, representative of an a posteriori information item on the coded bits. The step $I_1$ is followed by a step $I_2$ consisting in extracting the second extrinsic information stream from the second weighted-output stream representative of the a posteriori information items on the coded bits, so as to generate the third extrinsic information stream on the coded bits $EIDS_3$. In the case of the implementation of step $I_1$ in the form of an SISO decoding on the basis of the first outer code $C^0$, the extraction step in step $I_2$ is also a subtraction step by reason of the logarithmic nature of the constituent digital values of the streams $EIDS_2$ and APOSO.

A theoretical demonstration of the operating mode of the decoding method, which is the subject of the present invention, as described in conjunction with FIGS. 2a, 2b and 2c, will now be given hereinbelow.

In general, it is indicated that the equalization and joint decoding process implemented in step G, and more specifically in step $G_2$ of FIG. 2b, is implemented on the set of layers of rank m on each of the v concomitant bursts, successively, so as to calculate the first extrinsic information stream on the bits coded by the first outer code and interleaved, that is to say the stream $EIDS_1$, from the extrinsic information stream on the bits coded by the first outer code and interleaved and arising from a decoding on the basis of the outer code $C^0$, the aforesaid extrinsic information stream EIDS, constituting the a priori information item on the coded bits api.

It is indicated in a conventional manner that this calculation is performed on the basis of an estimate of the coefficients of the transmission channel, this estimate being obtained on the basis of the learning symbols received in the elementary streams of modulation symbols received $TEILCDS_m$.

In the case, as represented in FIG. 2b, where the equalization and joint decoding process carried out in step $G_2$ is of SISO type on the basis of the second inner coding $\Xi^m$, the inputs and outputs of this decoding corresponding to sequences of logarithmic value of the ratio of the extrinsic probabilities on each of the bits of each modulation symbol observed from the set of N symbol sequences observed by the set of reception antennas, these observed sequences being denoted $$\{y_1^r, \ldots, y_\tau^r\}_{r=1}^{r=\rho}$$

and of length $\tau$ in terms of number of observed symbols received, the estimate of the transmission channel being expressed in the form of a set of estimates of the coefficients of each elementary channel of a transmission antenna with all the reception antennas in the form $$\hat{H} = \{h^{t,m,r}\}_{t=1, m=1, r=1}^{\eta_m, \nu, \rho}.$$

At the first iteration of the iterative process of equalization and joint detection, the calculation is performed in the absence of any prior information, the estimated values of the coefficients of the elementary channels being calculated simply from the learning sequences and the corresponding sequences obtained on the modulation symbols observed. The sequences of streams of weighted outputs on the bits of user frames $EUDSSO_m$ obtained on completion of step $G_2$ are classed by frames, subjected to the step $G_3$ of extraction and in particular of subtraction on the basis of the a priori information item api obtained for each of the layers from the demultiplexing operation $G_1$, the extrinsic information streams on the bits of the user frames which were obtained on completion of step $G_3$ and denoted $$\{EIEUSO_m\}_{m=1}^{m=v}$$

then being subjected to the multiplexing operation of step $G_4$, so as to generate the first stream of extrinsic information on the bits coded by the first outer code and interleaved $EIDS_1$ mentioned previously.

The deinterleaving operation carried out in step H of FIG. 2a on the first extrinsic information stream on the bits coded by the first outer code and interleaved then makes it possible to generate the second stream of extrinsic information on the coded bits originating from the equalization and joint decoding process $EIDS_2$, which constitutes a new sequence of logarithmic values of intrinsic probability ratio on the coded bits, for the step of outer decoding I on the basis of the outer code $C^0$.

The aforesaid step I of decoding on the basis of the outer code $C^0$ is then performed, as represented in FIG. 2c, by the succession of steps $I_1$ and $I_2$ by means of an SISO type decoding and in particular of a BCJR algorithm in the logarithmic domain, the decoding step $I_1$ making it possible under these conditions to evaluate the sequence of the logarithmic values of the extrinsic probability ratios on each of the bits of each of the symbols coded by way of the first outer code $C^0$. This sequence is obtained following the extraction by subtraction in step $I_2$ of the second extrinsic information stream on the coded bits $EIDS_2$, from the weighted-output stream representative of the a posteriori information item on the aforesaid coded bits APOSO. The third stream of extrinsic information on the coded bits $EIDS_3$, which is representative of the logarithmic value of the extrinsic probability ratios on each of the symbols coded by the first outer code $C^0$ is then subjected in step J to an interleaving so as to generate the a priori information item EIDS=api. This a priori information item api is then reinjected at the level of the SISO equalization and decoding process $G_2$ of FIG. 2b, by way of a demultiplexing $G_1$ over the set of v pathways or user frames. The set of the corresponding information for each frame and following burstwise segmentation, so as to constitute the set of a priori information streams on the bits of user frames divided into bursts or packets, is thus reintroduced at the level of the equalization and joint decoding process $G_2$. The aforesaid equalization and joint decoding process $G_2$ then performs the equalization and spatio-temporal decoding on n frames of v sequences of logarithmic value of ratio of a priori probability on the bits of the modulation symbols observed $$\{MSDS_r\}_{r=1}^{r=\rho}.$$

The method which is the subject of the present invention as described in FIG. 2a and in particular in FIGS. 2b and 2c, makes it possible to nest an additional process for reestimating each distinct elementary channel generating intersymbol interference into the conventional iterative turbo-detection process.

A more detailed description of a system for coding a digital data stream coded by spatio-temporal combinations, in multiple transmission and reception, in accordance with the subject of the present invention, will now be given in conjunction with FIGS. 3a and 3b.

Figure 3A:
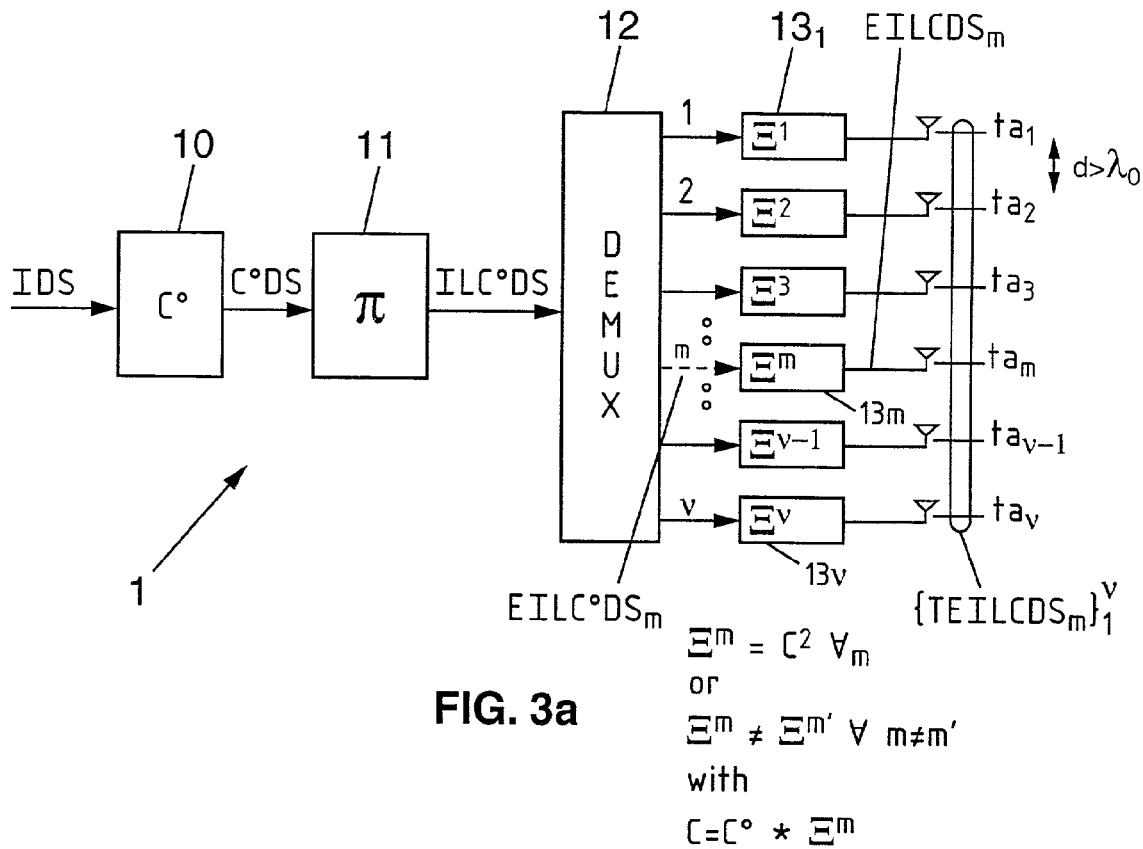
FIG. 3a represents, by way of illustration, a functional diagram of a system for coding data streams coded by spatio-temporal combinations in transmission and in reception, in accordance with the subject of the present invention.

As represented in FIG. 3a, it is indicated that the coding system, which is the subject of the present invention, advantageously includes a module 10 for outer coding of an initial digital data stream on the basis of a first code of specified rate $C^O$, so as to generate the aforementioned coded digital stream $C^ODS$. The outer coding module 10 is followed by a blockwise interleaving module 10 making it possible, on the basis of the coded digital stream $C^ODS$, to generate an interleaved coded digital stream exhibiting, owing, on the one hand, to the outer coding previously introduced and to the interleaving carried out, on the other hand, specific temporal diversity. The interleaved coded digital stream is denoted $ILC^ODS$.

This interleaving module 11 is itself followed by a demultiplexer module 12 receiving the interleaved digital stream $ILC^ODS$, the demultiplexer module 12 making it possible to generate a number v of elementary interleaved coded digital streams, these elementary interleaved coded digital streams being subdivided into frames, themselves subdivided into bursts, as described previously in the description.

In FIG. 3a, each elementary interleaved coded digital stream or each frame constituting a layer of rank m is denoted $EILC^ODS_m$.

The coding system which is the subject of the invention furthermore includes, as represented in FIG. 3a, a plurality of coding modules, denoted $13_1$ to $13_v$, each coding module making it possible to apply an inner coding on the basis of at least one second code of specified rate, denoted $\Xi^1, \ldots \Xi^m, \ldots \Xi^v$, each inner coding module receiving one of the elementary interleaved coded digital streams, that is to say a user frame, so as to generate the set of elementary digital streams coded by spatio-temporal combinations and consisting of symbols denoted $EILCDS_m$.

Furthermore, a plurality of transmission antennas $$\{ta_m\}_{m=1}^{m=v}$$

is provided and makes it possible to achieve the transmission of each elementary digital stream coded by spatio-temporal combination and consisting of symbols, a distinct transmission antenna of rank m achieving the transmission of the elementary digital stream $EILCDS_m$.

According to a noteworthy aspect of the coding system, which is the subject of the present invention, the set of transmission antennas forms a space-diversity array, each transmission antenna $ta_m$ being distanced from a neighbouring transmission antenna $ta_{m'}$ with m≠m', by a distance d>$\lambda_0$, as mentioned previously in the description, $\lambda_0$ designating the wavelength of the carrier wave ensuring the transmission of the aforesaid elementary digital streams.

Having regard to the makeup of the set of transmission antennas as an array of space-diversity antennas, the system which is the subject of the present invention thus makes it possible to generate a set of transmitted elementary digital streams, denoted $$\{TEILCDSm\}_{m=1}^{m=v},$$

which exhibits spatial and temporal diversity, by reason, on the one hand, of the outer coding introduced by the coding module 10 and the interleaving module 11 and, on the other hand, of the processing by layers of rank m of each frame, of the spatio-temporal coding introduced by each inner coding module $13_1$ to $13_v$ and of the transmission by each of the constituent antennas of the aforesaid array of antennas.

Figure 3B:
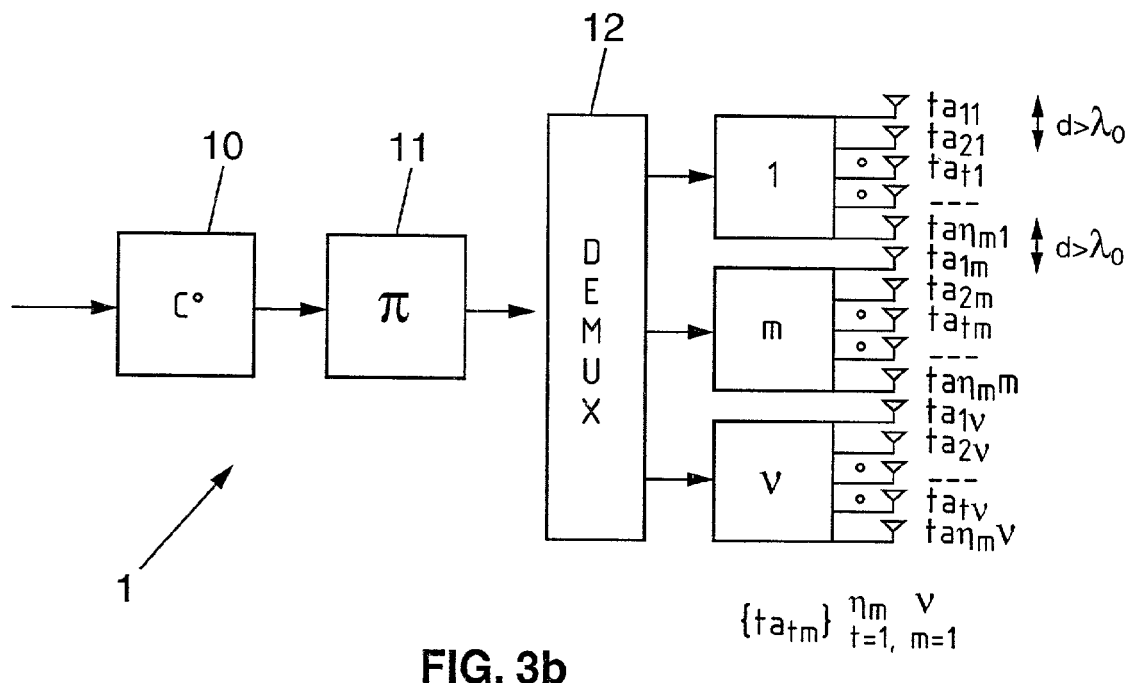
FIG. 3b represents, by way of illustration, a functional diagram of a system for coding data streams coded by spatio-temporal combinations in transmission and in reception, in accordance with the subject of the present invention as represented in FIG. 3a, in which the transmission antennas are grouped into groups of antennas forming an array of space-diversity antennas.

FIG. 3b represents a particular nonlimiting embodiment of the coding system which is the subject of the present invention, as represented in FIG. 3a where of course the same references designate the same elements.

However, in the embodiment represented in FIG. 3b, in particular, the second inner coding $\Xi^m$ of spatio-temporal trellis coded modulation type makes it possible to generate a stream of modulation symbols and the distinct transmission antennas are arranged in groups of antennas each transmitting a stream of modulation symbols. In FIG. 3b, each group of antennas is deemed to include $\eta_m$ transmission antennas, the corresponding antennas being denoted:

$$ta_{11}, \ldots, ta_{r1}, \ldots, ta_{\eta_1 1}; ta_{1v}, \ldots, ta_{rv}, \ldots ta_{\eta_v v}$$

where t designates the rank of the transmission antenna in the group of layer m and m designates the rank of the group of antennas and also the rank of the inner coding module, $13_m$, making it possible to apply the inner coding $v^m$. Furthermore, with reference to FIG. 3b, it is indicated that each distinct transmission antenna constitutes in the corresponding group of transmission antennas a space-diversity array with the other antennas of this same group, each antenna of one and the same group being distanced from a neighbouring antenna belonging to this same group by a distance d greater than $\lambda_0$, as mentioned previously in the description, the groups of distinct transmission antennas for each type of spatio-temporal trellis coded modulation forming a sub-array of space-diversity antennas.

It is thus understood that, by virtue of the implementation of the coding system, which is the subject of the present invention, as represented in FIG. 3a or 3b, this system makes it possible to ensure the transmission of a set of transmitted elementary digital streams exhibiting spatial and temporal diversity, in accordance with the coding method, which is the subject of the present invention. Nonlimitingly, it is indicated that, in the case of FIG. 3b, the number of antenna groups and the number of antennas per group may advantageously satisfy the relation $$\eta = \sum_{m=1}^{v} \eta_m$$

where η designates the total number of transmission antennas.

A description of a system for decoding a digital data stream coded by spatio-temporal combinations, in accordance with the coding method which is the subject of the invention, in multiple transmission and reception, this coded digital data stream consisting of at least a set of transmitted elementary digital streams, as described previously in the description, will now be given in conjunction with FIG. 4a and the following figures.

Figure 4:
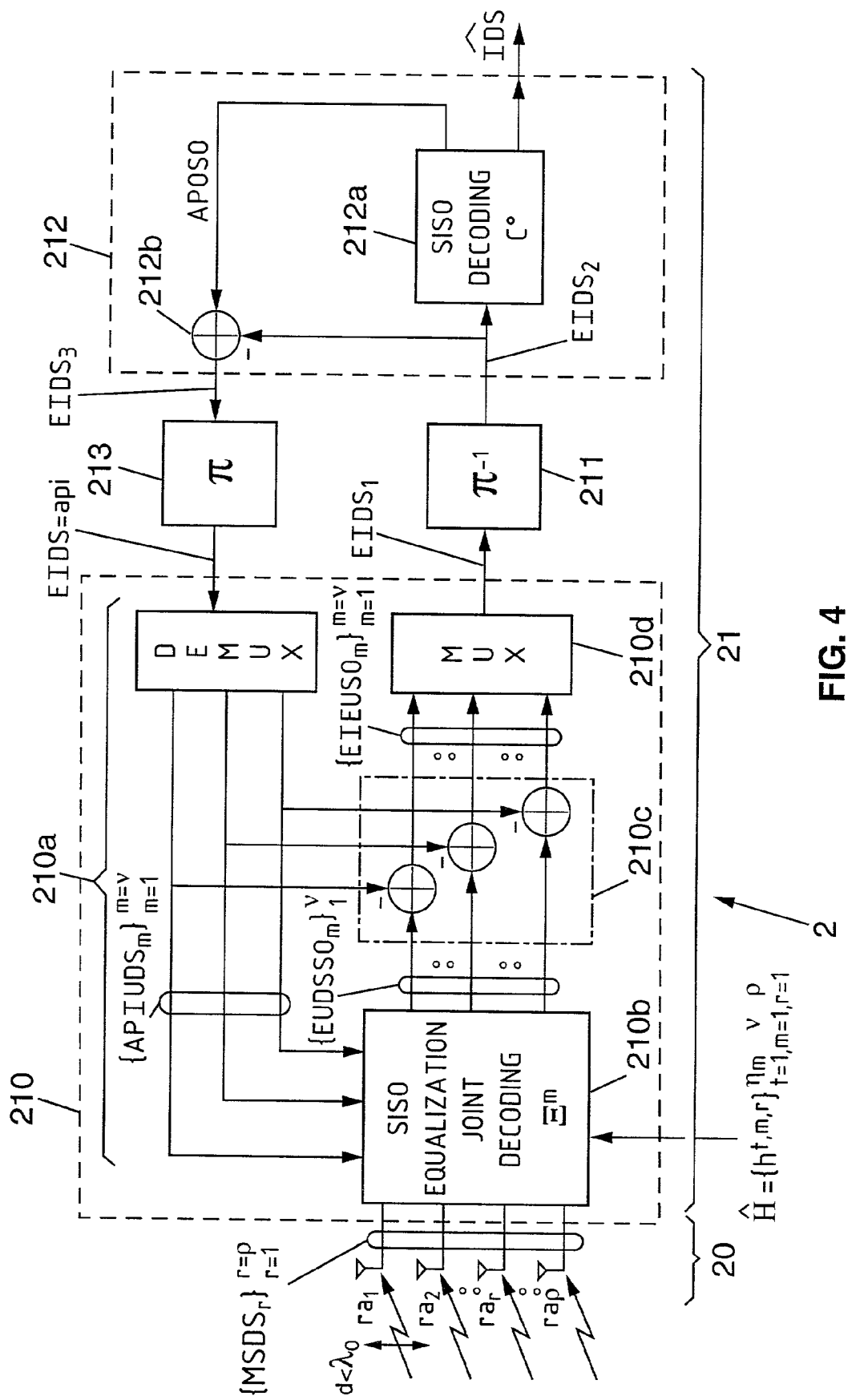
FIG. 4 represents, by way of illustration, a functional diagram of a system for coding data streams coded by spatio-temporal combinations in transmission and in reception, in accordance with the subject of the present invention.

With reference to the aforesaid FIG. 4a, the decoding system which is the subject of the present invention comprises a plurality of reception antennas, denoted $$\{ra_r\}_{r=1}^{r=\rho},$$

these reception antennas making it possible to receive the set of elementary digital streams transmitted by the transmission channel constituted by the set of elementary transmission channels, as described previously in the description.

According to a noteworthy aspect of the decoding system, which is the subject of the present invention, the aforesaid reception antennas can be fewer in number or equal to the number ν of transmission antennas and form an array of space-diversity reception antennas 20, so as to define a set, denoted $$\{MSDS_r\}_{r=1}^{r=\rho},$$

of elementary streams of modulation symbols received. The array 20 of space-diversity reception antennas is followed by a module 21 for turbo-detection of the elementary streams of aforesaid modulation symbols received by equalization and joint detection and iterative decoding, as described previously in the description in relation to the decoding method which is the subject of the present invention.

As represented more specifically in FIG. 4a, the turbo-detection module 21 includes a module 210 for equalization of the transmission channel and for joint decoding by means of the second inner coding $\Xi^m$ on the basis of a stream of extrinsic information on the bits coded by the first outer code and interleaved, this extrinsic information stream arising from a decoding on the basis of the first outer code $C^0$ and constituting an a priori information item on the previously mentioned coded bits. In FIG. 4a, the extrinsic information stream on the bits coded by the first outer code and interleaved is denoted EIDS=api by reason of the fact that this stream in fact constitutes an a priori information item api on the coded bits.

The module 210 for equalization of the transmission channel and for joint decoding makes it possible, on the basis of the elementary streams of modulation symbols received $MSDS_r$, to generate a first extrinsic information stream $EIDS_1$ on the bits coded by the first outer code and interleaved. The module 210 for equalization of the transmission channel and for joint decoding is followed by a module 211 for deinterleaving, denoted by $\pi^{-1}$, of the first extrinsic information stream $EIDS_1$ so as to generate a second extrinsic information stream on the coded bits $EIDS_2$ originating from the equalization and joint decoding module 210.

Furthermore, a module 212 for decoding on the basis of the first outer code $C^0$ is provided, which receives the second extrinsic information stream $EIDS_2$ delivered by the interleaving module 211, so as to generate a third extrinsic information stream $EIDS_3$ on the coded bits, this third extrinsic information stream arising from the decoding on the basis of the first outer code $C^0$.

Of course, the module 212 for decoding on the basis of the first outer code makes it possible to obtain an estimate, denoted $\widehat{IDS}$, of the initial digital stream IDS transmitted, in accordance with the coding method and by virtue of the coding system which is the subject of the present invention, previously described in the description.

A module 213 for interleaving the third extrinsic information stream $EIDS_3$ is also provided, so as to generate the extrinsic information stream on the bits coded by the first outer code and interleaved, and denoted IDS=api, constituting the a priori information item on the coded bits, which information item is reinjected into the module 210 for equalization of the transmission channel and for joint decoding.

The decoding system, which is the subject of the present invention, as represented in FIG. 4a, will now be described in more detail with reference to the same figure in the case where the a priori information item on the coded bits consists of a logarithmic value of the extrinsic probability ratio of the aforesaid coded bits, this a priori information item possibly being obtained in particular when the equalization and joint decoding process is an SISO process, that is to say one with soft input and soft output.

With reference to FIG. 4a, it is indicated that the equalization and joint decoding module 210 comprises, in the aforesaid embodiment, a module $210_a$ for injecting the a priori information item api, comprising a demultiplexer module, denoted DEMUX, the demultiplexer module delivering, from the aforesaid a priori information item, consisting of the extrinsic information stream on the bits coded by the first outer code and interleaved EIDS=api, a set of streams of a priori information items on the bits of user frames, which stream is denoted $$\{APIDUS_m\}_{m=1}^{m=\nu},$$

It is of course understood that in order to ensure equalization and joint decoding on the basis of layers, that is to say on the basis of frames and on the basis of bursts actually transmitted, as described previously in the description related to the coding method, which is the subject of the present invention, the object of the demultiplexer module DEMUX is to demultiplex the extrinsic information stream EIDS on the bits coded by the first outer code and interleaved, constituting the a priori information item on the coded bits, over one and the same number ν of demultiplexing pathways as the number of elementary coded and interleaved digital streams generated on transmission.

Under these conditions, the equalization and joint decoding module furthermore comprises a decoding module $210_b$ with weighted input and output, SISO module, which receives as input, on the one hand, the stream of a priori information items on the bits of user frames $$\{APIDUS_m\}_{m=1}^{m=\nu}$$

and, on the other hand, the elementary streams of modulation symbols received $$\{MSDS_r\}_{r=1}^{r=\rho}.$$

Of course, the weighted inputs/outputs decoding module $210_b$ also receives the estimate of the coefficients of the transmission channel $$\widehat{H} = \{h^{t,m,r}\}_{t=1,m=1,r=1}^{\eta_m, \nu, \rho}$$

of the coefficients of the elementary transmission channels.

The decoding module $210_b$ delivers a stream, denoted $$\{EUDSSO_m\}_{m=1}^{m=v},$$

of weighted outputs on the bits of user frames.

The module $210_b$ is followed by a plurality, denoted $210_c$, of subtractor modules, each subtractor module making it possible to subtract from each stream of weighted outputs on the bits of the user frames $\{EUDSSO_m\}$ the a priori information item on the bits of user frames $\{APIUDS_m\}$ so as to deliver a stream, denoted $$\{EIEUSO_m\}_{m=1}^{m=v},$$

of extrinsic information on the bits of the user elementary streams.

A multiplexer module $210_d$ is then provided, this multiplexer module receiving the extrinsic information streams $EIEUSO_m$ on the bits of the user frames and delivering the first extrinsic information stream on the bits $EIDS_1$ coded by the first code and interleaved to the deinterleaving module 211.

Furthermore, with reference to the same FIG. 4a, it is indicated that the module 212 for decoding on the basis of the first outer code $C^O$ can comprise a decoding module $212_a$ with weighted inputs/outputs, receiving the aforesaid second stream of extrinsic information on the coded bits $EIDS_2$ originating from the equalization and joint decoding process implemented by the module 210, the decoding module with weighted inputs/outputs $210_a$ delivering a stream of weighted outputs which is representative of an a priori information item on the coded bits APOSO. The module $212_a$ is associated with a subtractor module $212_b$ making it possible to subtract the weighted-outputs stream representative of an a priori information item on the coded bits APOSO, the second stream of extrinsic information $EIDS_2$ so as to deliver the third stream of extrinsic information on the coded bits $EIDS_3$ which arises from the decoding on the basis of the first outer code $C^O$.

A demonstration of the operating mode of the SISO type equalization and joint decoding module $210_b$ will now be given hereinbelow, when the second inner coding is a coding of spatio-temporal trellis coded modulation type ST-TCM.

Under these conditions, the aforesaid equalization/joint decoding process can be regarded as a discrete Markov module with a finite number of states, consisting of the $v$ elementary ST-TCM codings, and followed by $\eta$ transverse filters each including $\chi_c$ coefficients.

For each layer of rank m, each discrete instant of rank n, sampling instant, for any observed input symbol $$\underline{u}_n^m$$

comprising $k_m$ bits, the spatio-temporal inner coding $\Xi^m$ of constraint length $\chi_m$ produces a coded symbol $$\underline{x}_n^m$$

comprising $n_m$ bits, which are dispersed and transmitted in parallel over the $\eta_m$ pathways or transmission antennas.

On each of the transmission pathways t, the bits of symbols $$\underline{a}_n^{m,t}$$

are matched with a complex symbol previously designated $$z_n^{m,t}$$

according to a matching rule in accordance with the ST-TCM coding, this matching rule $\Xi^m$ also being designated as a mapping rule. Consequently, the set of symbols transmitted according to their complex representation $$\{z_n^{m,t}\}_{t=1}^{t=\eta^m}$$

is a function of the state of spatio-temporal coding ST, state designated by $$v_n^m$$

and of the sequence of input symbols $$\underline{u}_n^m,$$

Under these conditions, the sequence of complex symbols satisfies relation (4):

$$\{z_n^{m,t}\}_{t=1}^{\eta_n^m} = \psi(v_n^m; \underline{u}_n^m) \qquad (4)$$

For a finite-state discrete Markov model associated with any layer of rank m including the trellis $\Xi^m$ and the memory of the channel $\chi_c-1$ whose states are given by relation (5):

$$s_n^m = \{\{z_{n-\chi_c+1}^{m,t}, \cdots, z_{n-1}^{m,t}\}_{t=1}^{\eta m}; v_n^m\} \qquad (5)$$

Under these conditions the set of sequences of complex symbols, expressed according to relation (6):

$$\{\{z_{n-\chi_c+1}^{m,t}, \cdots, z_{n-1}^{m,t}\}_{t=1}^{\eta m} \qquad (6)$$

corresponds to a path taking into account the combined Markov processes between an earlier state denoted $$s_{n-\chi_c+1}^m$$

and the present state $$s_n^m,$$

in accordance with the law of temporal coding according to relations (7) and (8):

$$v_{n+1}^m = \phi_v^m(v_n^m; u_n^m) \quad (7)$$

$$x_n^m = \phi_x^m(v_n^m; u_n^m) \quad (8)$$

In the above relations, it is recalled that $$u_n^m$$

designates the groups of bits forming an input symbol and $$v_n^m$$

designates the states of the aforesaid Markov model, $$\phi_v^m$$

designating the temporal coding law specific to each inner coding of rank m implemented in accordance with the subject of the present invention.

Generally, it is indicated that the temporal coding laws are regarded as invariable over time so as to simplify the explanation of the process. However, a generalization of the process to time-varying temporal coding laws constitutes an application which can be envisaged to the coding/decoding method, which is the subject of the present invention, coming within its field of equivalents.

Furthermore, between discrete time values n−1 and n, the transitions $$\vartheta_n^m$$

of the corresponding combined Markov model can be expressed according to relation (9):

$$s_n^m : u_n^m \rightarrow s_{n+1}^m \quad (9)$$

and then lead to a set of transmitted complex symbols, which is expressed in the form $$\{z_n^{m,t}\}_{t=1}^{\eta_m}$$

for each of the transmission branches or layers of rank m.

Under these conditions, with reference to relations (7) and (8), the combined state of the model obtained can be expressed in terms of sequences of coded output symbols of the form $$\{x_{n-\chi_c+1}^m, \cdots, x_{n-1}^m\}$$

in the form of relation (10):

$$s_n^m = \{\{x_{n-\chi_c+1}^m, \cdots, x_{n-1}^m\}; v_n^m\}. \quad (10)$$

Equivalently, these sequences of output symbols can be expressed in terms of sequences of input symbols, expressed by $$\{u_{n-\chi_c+1}^m, \cdots, u_{n-1}^m\}$$

as satisfying relation (11):

$$s_n^m = \{v_{n-\chi_c+1}^m; \{u_{n-\chi_c+1}^m, \cdots, u_{n-1}^m\}\} \quad (11)$$

The operating mode of the ST-TCM coding can also be described by the introduction of reduced states $$v_n^m,$$

which consist of a memory truncation of the corresponding full state $$v_n^m.$$

For a reduced constraint length $k_m < \chi_m$ of the temporal coding, temporal coding laws can be rewritten according to relations (12) and (13):

$$v_{n+1}^m = \varphi_v^m(v_{n-(\chi_m-k_m)}^m; \{u_{n-(\chi_m-k_m)}^m, \cdots, u_n^m\}) \quad (12)$$

$$x_n^m = \varphi_x^m(v_{n-(\chi_m-k_m)}^m; \{u_{n-(\chi_m-k_m)}^m, \cdots, u_n^m\}) \quad (13)$$

With reference to the above relations (12) and (13) and in the same manner as above with regard to relations (7) and (8), the combined state of the Markov model can be expressed in terms of sequences of input symbols $$\{u_{n-\chi_c+1-(\chi_m-k_m)}^m, u_{n-1}^m\}$$

as satisfying relation (14):

$$s_n^m = \{v_{n-\chi_c+1-(\chi_m-k_m)}^m; \{u_{n-\chi_c+1-(\chi_m-k_m)}^m, \cdots, u_{n-1}^m\}\} \quad (14)$$

The set of the above relations, relating to the inner coding process implemented in the case of the coding method, which is the subject of the present invention as described previously in the description, makes it possible to define the combined trellis associated with the ST-TCM elementary coding process.

The time progression of the state sequences produced by the combined Markov process described above can be depicted through a trellis diagram, denoted $T^m$, whose vertices and transitions at all depths or sections of rank n, n designating a discrete time variable, correspond to the states and transitions $$s_n^m$$

and $$b_n^m$$

defined above. $V^m$ and $B^m$ denote the vertices and the space of branches of the trellis diagram $T^m$. Likewise, $$V_n^m$$

and $$B_n^m$$

denote the space of vertices and of branches at the depth and at the section n respectively. It is recalled that a section is defined as the set of branches contained between two discrete instants of adjacent depths n, n−1.

It is furthermore indicated that, when the trellis is regular, as assumed within the framework of the present description, any trellis section $$B_n^m$$

is sufficient to describe the evolution of the Markov process from a discrete time n−1 to a discrete time n. Furthermore, at the level of any depth n of the trellis according to the discrete-time variable, the space of vertices $$V_n^m$$

can be identified as a single finite state space, consisting of all the possible states of the combined Markov process.

Finally, denoting by |.| the cardinality of each space and by reason of the fact that, at each depth of rank n $2^{\kappa_m(\chi_c-1)}$ intersymbol interference states are combined with each encoding state, the complexity state of the resulting combined trellis satisfies relation (15):

$$|V_n^m| = 2^{\kappa_m(\chi_c-1)}|V_n^{m,stc}| \quad (15)$$

In the above relation (15), $$V_n^{m,stc}$$

designates the state of the space of the $m^{th}$ ST-TCM trellis. Furthermore, by reason of the fact that, exactly $2^{k_m}$ transitions emerge from each state, the complexity of the space of branches of the combined trellis at each section n satisfies relation (16):

$$|B_n^m| = 2^{\kappa_m}|V_n^m| \quad (16)$$

The generalization of the above approach to the entire multilayer structure, that is to say the entire structure consisting of the pathways multiplexed and coded according to the inner coding on transmission, can be made explicit in the manner below. The input states and sequences of the combined Markov model are akin to the concatenation of the input states or sequences of the combined elementary Markov processes modelling each ST-TCM inner coding, followed by subgroups of corresponding channels generating intersymbol interference.

The combined trellis associated with this model, denoted $T^\theta$, is the Cartesian product θ of the ν combined trellises $$\{T^m\}_{m=1}^{m=v}.$$

For this reason, the complexity values of the spaces of branches and of vertices satisfy relations (17) and (18):

$$|V_n^\otimes| = \prod_{m=1}^{v} |V_n^m| \quad (17)$$

$$|B_n^\otimes| = |V_n^\otimes| \cdot \prod_{m=1}^{v} 2^{\kappa_m} \quad (18)$$

In the above relations, $$V_n^\otimes, B_n^\otimes$$

and $$V_n^m, B_n^m$$

designate the space of the vertices and branches of the combined trellis $T^\Theta$ and of the elementary trellis $T^m$ of rank m at each section $n\epsilon[1,\eta]$.

The implementation of an equalization and joint decoding module of SISO type, module $210_b$ in FIG. 4a, to carry out the iterative process of equalization and joint decoding associated with the outer decoding, is aimed at calculating the logarithmic value of the ratio of a posteriori probability of each constituent bit of each input symbol $$\underline{u}_n^m$$

at each discrete instant $n\epsilon[1,\tau]$ and, of course, for each of the layers $m\epsilon[1, \nu]$.

Such a calculation can be implemented in software manner for example, by applying the BCJR algorithm as described by L. R. BAHL, J. COCKE, F. JELINEK, J. RAVIV in the article entitled "*Optimal Decoding of Linear Codes for Minimizing Symbol Error Rate*", IEEE France. Inform. Theory, Vol. IT-20, pp. 284–287, March 1974. The aforesaid algorithm must then be applied to the whole of the multilayer combined trellis $T^\Theta(V^\Theta, B^\Theta)$.

However, the calculations and memory space required for the implementation of the aforesaid optimum algorithm being substantially linear as a function of the complexity of the space of branches $|B^\Theta|$, such a maximum a posteriori approach (MAP) turns out to be very rapidly prohibitive in terms of complexity and cannot be implemented in practice.

One possibility, in accordance with the implementation of the decoding method and of the decoding system, which are the subjects of the present invention, for surmounting this difficulty relating to complexity, can consist in restricting each of the combined elementary trellises $T^m$ to subtrellises, denoted $T^m(V^m, B^m)$, these subtrellises being obtained by truncating the effective constraint length $\chi_c$ of the elementary transmission channels and reducing this length to an arbitrary value, the value $\kappa_m \epsilon[1, \chi_c]$. The reference to the index m of the arbitrary value $\kappa_m$ indicates that this value can vary from one layer to the next layer.

Under these conditions, the substates of each subtrellis $T^m$ are defined according to relation (19):

$$s_n^m = \{v_{n-\kappa+1}^m; \{u_{n-\kappa_m+1}^m, \ldots, u_{n-1}^m\}\} \quad (19)$$

By way of specific example, it is indicated that when the arbitrary value $\kappa_m$ is chosen equal to 1, the combined elementary trellises are reduced to pure ST-TCM trellises.

A particularly advantageous further reduction can even be obtained by reducing the constraint length of the temporal codings for example. In the latter case, the combined elementary trellises are reduced to subtrellises of pure ST-TCM trellises.

Having regard to the fact that only a part of the memory of the transmission channels and of the ST-TCM elementary codings is taken into account in the substates of the combined multilayer trellises, the modulated signals in the form of transmitted complex symbols $$\{z_n^{m,t}\}_{t=1}^{t=\nu}$$

involved in the calculation of the Euclidean branch metrics, but which are not however directly accessible, must be explicitly recalculated by the technique known as per survivor processing PSP.

With the aim of reducing the well-known effect resulting from error propagation, the PSP technique requires that the transmission channels from all the transmission antennas to all the reception antennas be phase-minimum channels. Unfortunately, as described in the prior art, it is not usually possible to implement a finite length filter in multiple transmission/reception making it possible to exactly meet the aforesaid phase-minimum constraint.

However, a processing process consisting of a generalization of the reduced-constraint Viterbi algorithm, known as the GVA algorithm, has been proposed. The basic idea of the aforesaid GVA processing process consists in compensating for the performance degradation introduced by the abovementioned PSP processing while retaining a number $\Omega$ of survivor paths greater than 1 per substate. This processing process is here designated GPSP standing for Generalized Per Survivor Processing. When such an algorithm is applied to an equalization and joint decoding process, the GVA generalized Viterbi algorithm turns out to be very robust to the phenomenon of error propagation as described by R. VISOZ, P. TORTELIER and A. O. BERTHET in the article entitled IEEE Electronic Letters, Vol. 36, No. 3, pp. 227–228, February 2000, previously cited in the description.

In particular, the aforesaid GPSP processing process renders the implementation of phase-minimum prefiltering superfluous.

Having regard to these general considerations, the equalization and joint detection module $210_b$ can be implemented in the form of a software module based on SISO type equalization and joint decoding algorithms specially tailored to carry out equalization and multilayer joint decoding, and which are substantially improved by virtue of the use of GPSP processing.

Among the various SISO type equalization and joint decoding algorithms which can be used for the implementation of the aforesaid module $210_b$, mention may be made of the SISO algorithm for optimal multilayer detection and for spatio-temporal decoding, the forward and reverse recursion generalized reduced- state BCJR type algorithm and, finally, in a preferred embodiment which alone will be described in the present description hereinbelow, the generalized reduced-state SOVA type algorithm with a single recursion pathway.

The implementation of the abovementioned generalized reduced-state SOVA type algorithm with a single recursion pathway allows a significant reduction, both in terms of computational complexity and of memory space required, through the elimination of the backward recursion and processing of the soft outputs, that is to say of the variables or logarithmic values of a priori probability ratio during the forward recursion, as proposed within the framework of the SOVA algorithm by J. HAGENAUER, P. HOEHER in the article entitled "*A Viterbi Algorithn with Soft Decision Outputs and its Applications*", published by Proc., IEEE, Globecom, 89, pp. 1680–1686, Dallas, USA, November 1989.

For the implementation of the aforesaid generalized reduced-state SOVA type algorithm, within the framework of the decoding method and system which are the subjects of the present invention, it is assumed that, at each discrete time section n−1 and at each starting substate $$s' \in V_{n-1}^{\otimes}$$

the following quantities or entities are available:
an ordered list $$L_1 = \left\{ \vec{\mu}_{n-1,\,\omega}^{s'}, \omega \in [1, \Omega] \right\}$$

of $\Omega$ metrics of substates accumulated by forward recursion;
an ordered list $$L_2 \left\{ \hat{\underline{u}}_{k=n-\theta-1,\,\omega}^{n-1\;s'}, \omega \in [1, \Omega] \right\}$$

of the $\Omega$ corresponding survivor paths, defined by $L_3$:

$$\hat{\underline{u}}_{k=n-\theta-1\;\omega}^{n-1\;s'} = \left\{ \hat{u}_{n-\theta-1\;\omega}^{s'}, \hat{u}_{n-\theta\;\omega}^{s'}, \ldots, \hat{u}_{n-1\;\theta}^{s'} \right\}$$

and terminating at s';
an ordered list $$L_4 : \left\{ \hat{\underline{L}}_{k=n-\theta-1\;\omega}^{n-1\;s'}, \omega \in [1, \Omega] \right\}$$

of the $\Omega$ unsigned weighted values relating to each bit and defined by $$L_5 : \hat{\underline{L}}_{k=n-\theta-1\;\omega}^{n-1\;s'} = \left\{ \hat{L}_{n-\theta-1\;\omega}^{s'}, \hat{L}_{n-\theta\;\omega}^{s'}, \ldots, \hat{L}_{n-1\;\theta}^{s'} \right\}$$

and terminating at s'.

The SISO equalization and joint decoding module $210_b$ implementing the generalized reduced-state SOVA type algorithm with one recursion pathway then carries out just a forward recursion and at each section $n \in [1, \tau]$, for each termination substate $$s \in V_n^{\otimes},$$

calculates for each transition $$b \in B_n^{\otimes}$$

such that $b^+ = s$ and for all ranks $1 \leq \Omega$, the $$\Omega \times \prod_{m=1}^{\nu} 2^{k_m}$$

following entities, these entities satisfying relation (20):

$$\mu_{\vec{n},*}(s) = \mu_{\vec{n}-1,t}(b^-) + \xi_{n,t}(b) \tag{20}$$

with $$\xi_{n,t}(b) = \frac{1}{2\sigma^2} \sum_{r=1}^{\rho} \left\| y_n^r - \sum_{m=1}^{\nu} \sum_{t=1}^{\eta_m} \sum_{k=0}^{\chi_c - 1} z_{n-k}^{m,t} h_k^{m,t,r} \right\|^2 - l_n Pr(b)$$

where $\xi_{n,1}(b)$ designates the branch metric associated with branch b, Pr(b) designates the a priori probability on branch b, $l_n$ designating the Napierian logarithm.

The entities satisfying the aforesaid relation (20) are then ranked in order of ascending value.

The forward recursion is then implemented by taking account of the boundary conditions according to relation (21):

$$\mu_{\vec{0},1}(0) = 0 \mu_{\vec{0},\omega}(0) = \infty \text{ for } \omega > 1 \text{ and} \tag{21}$$

$$\mu_{\vec{0},\omega}(S) = \infty, \forall s \neq 0, \omega \in [1, \Omega]$$

Only the best $\Omega$ values of the aforesaid entities are then stored at the substates s in passing to the next section.

Simultaneously, the past survivor paths satisfying the relation:

$$\hat{\underline{u}}_{k=n-\theta-1\;\omega}^{n-1\;s'}, \omega \in [1, \Omega]$$

are extended according to the existing transitions s': $\underline{u}_n \rightarrow s$. The new $$\Omega \times \prod_{m=1}^{m=\nu} 2^{k_m}$$

potential survivor paths, denoted $$\hat{\underline{u}}_{k=n-\theta\;*}^{n\;s'},$$

are temporarily stored and sorted having regard to the rank of their associated metric $$\vec{\mu}_{n,*}(s)$$

but only the best $\Omega$ paths, in the sense of the metrics associated with them, are actually used for the step relating to the next section.

Similarly, weighted unsigned past values at the bit level, denoted:

$$\hat{L}_{k=n-\theta-1}^{n-1}{}_\omega^{s'}, \omega \in [1, \Omega]$$

are extended in accordance with the existing transitions s': $\underline{u}_n \rightarrow s$. The $$\Omega \times \prod_{m=1}^{m=\nu} 2^{\kappa_m}$$

new sequences of potential unsigned weighted values, denoted $$\hat{L}_{k=n-\theta}^{n}{}_*^{s}$$

are temporarily stored and sorted according to the rank of the metrics $$\vec{\mu}_n, *(s).$$

For each layer $m \in [1,\nu]$ and for each input bit $j \in [1,\kappa_m]$, the estimated unsigned weighted values $$\hat{L}_{n,m,j}{}_\omega^{s}$$

are initialized according to relation (22):

$$\hat{L}_{n,m,j}{}_\omega^{s} = \infty \quad (22)$$

Likewise, only the best $\Omega$ sequences of unsigned weighted values need to be stored for the step relating to the next section.

The equalization and joint decoding module $210_b$ then proceeds to the updating, by choosing the weighted values, of the SOVA type algorithm.

For each substate $$s \in V_n^{\otimes},$$

for each layer $m \in [1,\nu]$, for each input bit $j \in [1,\kappa_m]$ and for each rank of survivor $\omega \in [1,\Omega]$, the sequences of unsigned weighted value at the bit level are updated from the depth $k=n-1$ to the depth $k=n-\delta$ according to relation (23):

$$\hat{L}_{k,m,j}{}_\omega^{s} = f(\hat{L}_{k,m,j}{}_\omega^{s}, \Delta_{(n,m,j)_\omega}^{s}) \quad (23)$$

In the above relations, it is indicated that $\omega$ designates the ranking of the metrics at a node, $\theta$ designates the depth of computational lag and $\delta$ the depth of updating of the soft outputs, or weighted outputs. Generally, it is indicated that $\delta=\theta$.

In relation (23), it is indicated furthermore that f(.) is an adaptation or updating function and that $$\Delta_{(n,m,j)}{}_\omega^{s}$$

satisfies relation (24):

$$\Delta_{(n,m,j)}{}_\omega^{s} = \vec{\mu}_{n,\overline{\omega}_{m,j}}(s) - \vec{\mu}_{n,\omega}(s) \quad (24)$$

In the aforesaid relation (24), $\overline{\omega}_{m,j}$ satisfies relation (25):

$$\overline{\omega}_{m,j} = \min\{l \geq \Omega + 1, \hat{u}_{k,m,j}{}_l^{s} \neq \hat{u}_{k,m,j}{}_\omega^{s}\} \quad (25)$$

The updating function f(.) mentioned previously in relation (23) can be defined by relation (26):

$$f(\hat{L}_{k,m,j}{}_\omega^{s}, \Delta_{n,m,j}{}_\omega^{s}) = \ln \frac{1 + \exp(\hat{L}_{k,m,j}{}_\omega^{s}, \Delta_{n,m,j}{}_\omega^{s})}{\exp(\hat{L}_{k,m,j}{}_\omega^{s}) + \exp(\Delta_{n,m,j}{}_\omega^{s})} \quad (26)$$

and can, in the usual manner, be calculated according to an approximate value through relation (27):

$$f(\hat{L}_{k,m,j}{}_\omega^{s}, \Delta_{n,m,j}{}_\omega^{s}) \approx \min\{\hat{L}_{k,m,j}{}_\omega^{s}, \Delta_{n,m,j}{}_\omega^{s}\} \quad (27)$$

When $n \geq \theta$, the generalized SOVA type algorithm then delivers weighted decisions signed at the bit level on $\underline{u}_{n-\theta}$. The weighted values signed at the bit level satisfy relation (28):

$$\lambda(u_{n-\theta j}^{m}) = (2 \times \hat{u}_{n-\theta,m,j}{}_1^{s^*} - 1) \times \hat{L}_{n-\theta,m,n}{}_1^{s^*} \quad (28)$$

and are calculated for $m \in [1,\nu]$, $j \in [1,\kappa_m]$ by using the survivor path of first rank and the sequence of unsigned weighted values at the corresponding bit level, which values each terminate at section n in substate s* defined by relation (29):

$$s^* = \mathrm{argmin}\{u_{n,1}^{\rightarrow}(s), s \in V_n^{\otimes}\} \quad (29)$$

Finally, the logarithmic value of the extrinsic probability ratios usable on the bits $$u_{n-\theta,j}^m$$

is calculated by bitwise subtraction of the logarithmic value of a priori probability ratio $\lambda^a(u_{n-\theta,m,j})$ originating from the outer decoding $C^O$, so as to produce the signed weighted values satisfying relation (30):

$$\lambda^c(u_{n-\theta,j}^m) = \lambda(u_{n-\theta,j}^m) - \lambda^a(u_{n-\theta,j}^m) \quad (30)$$

With reference to FIG. 4a, it is indicated that the logarithmic values of the ratios of extrinsic probability on the bits $$u_{n-\theta,j}^m$$

constitute the extrinsic information streams on the bits of the user frames $$\{EIEUSO_m\}_{m=1}^{m=v}$$

and that the logarithmic value, expressed in the form $\lambda^a(u_{n-\theta,m,j})$, of the a priori probability ratios constitutes the a priori information item on the bits of the user frames $$\{APIUDS_m\}_{m=1}^{m=v}.$$

Various simulation results will now be given in conjunction with FIGS. 5a, 5b and 5c, these simulation results consisting of graphs representative of the bit error rate, denoted BER, as a function of the value of the signal-to-noise ratio $Eb/N_0$, expressed in dB, for one and the same original digital signal coded in accordance with the method which is the subject of the present invention, then transmitted and decoded in accordance with the same method which is the subject of the present invention, when the latter is implemented by means of an SOVA type equalization and joint decoding process, for various configurations of parametrization of the aforesaid process.

Figure 5A:
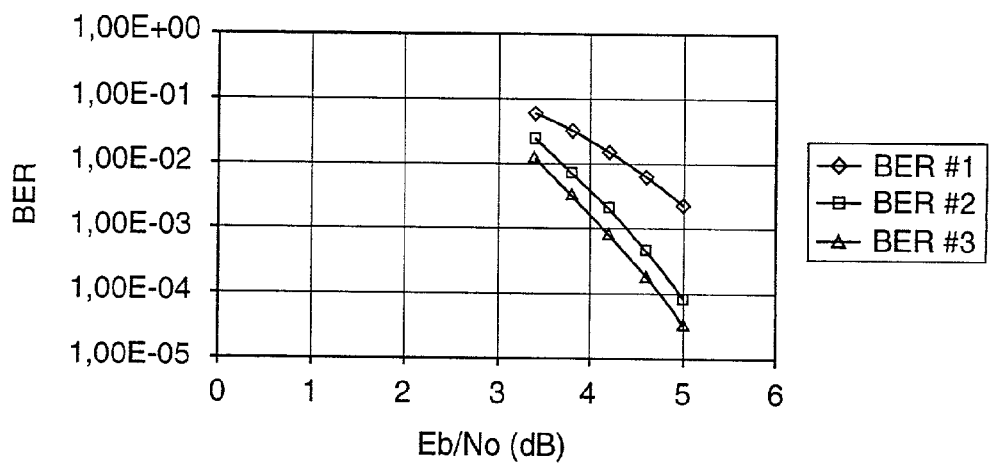
FIGS. 5a, 5b and 5c represent simulation charts for the value of the bit error rate BER as a function of the signal-to-noise ratio, expressed in dB, for a severe transmission channel, values obtained for various conditions of implementation of the coding/decoding method which is the subject of the invention.

Represented in FIG. 5a is the bit error rate BER for a first, a second and a third iteration, denoted #1, #2 and #3, for a severe normalized transmission channel of type EQ-3 and for a substantially constant spectral efficiency of the entire system equal to 3 bits/s/Hz. The number of transmission antennas was equal to 4 and the number of reception antennas equal to 2.

The outer code used $C^O$ was a systematic recursive convolutional code with eight states of rate 3/4 and the identical inner code $\Xi^m$ for each layer being for each layer a nonsystematic nonrecursive code of rate 1/2 with four states, mapped onto a constellation of QPSK type and producing a trivial ST-TCM.

Under these conditions, the overall rate of the coding is equal to 3/8.

The number of bursts is taken equal to n=8 per frame, and each burst contains 128 QPSK symbols.

The SOVA type detection joint equalization process is implemented for a traceback variable θ=15, a depth of renewal variable δ=15 and a number of survivor paths Ω=8. It is applied to an inner trellis reduced to 16 states.

For a given starting bit error rate, around $1.00 \times 10^{-1}$ at the first iteration, a reduction of the order of 1 dB is noted between the first and the second iteration, for a bit error rate equal to $1.00 \times 10^{-2}$.

Figure 5B:
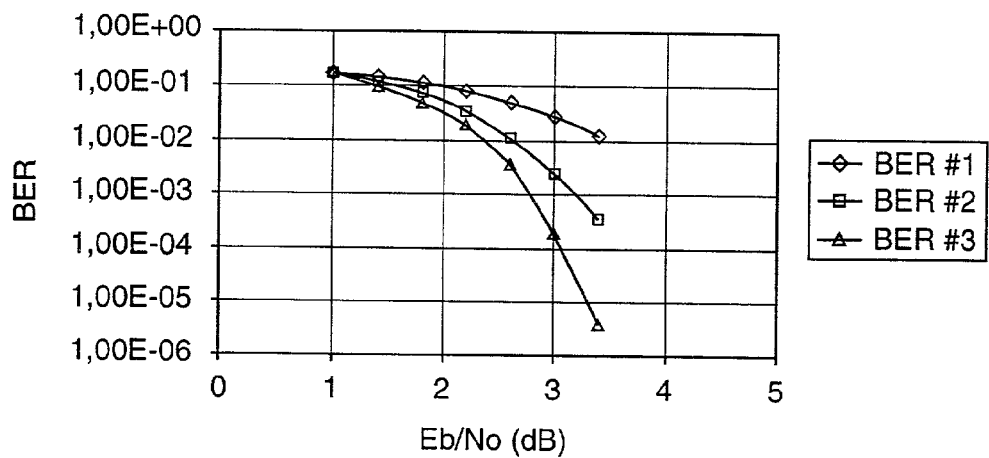

Represented in FIG. 5b is the bit error rate BER for a first, a second and a third iteration, denoted #1, #2 and #3, for a severe normalized transmission channel of type EQ-3 and for a substantially constant spectral efficiency of the entire system equal to 2 bits/s/Hz. The number of transmission antennas was equal to 3 and the number of reception antennas equal to 2.

The outer code used $C^O$ was a systematic recursive convolutional code with eight states of rate 2/3 and the identical inner code $\Xi^m$ for each layer being a nonsystematic nonrecursive code of rate 1/2 with 4 states, mapped onto a constellation of QPSK type and producing a trivial ST-TCM.

Under these conditions, the overall rate of the coding is equal to 1/3.

The number of bursts is taken equal to n=8 per frame, and each burst contains 128 QPSK symbols.

The SOVA type detection joint equalization process is implemented for a traceback variable θ=15, a depth of renewal variable δ=15 and a number of survivor paths Ω=8. It is applied to an inner trellis reduced to 16 states.

In FIG. 5b, for a bit error rate substantially equal to $1.00 \times 10^{-2}$, a gain in signal-to-noise ratio of the order of 1 dB may be noted between the first and the third iteration #1, #3.

Figure 5C:
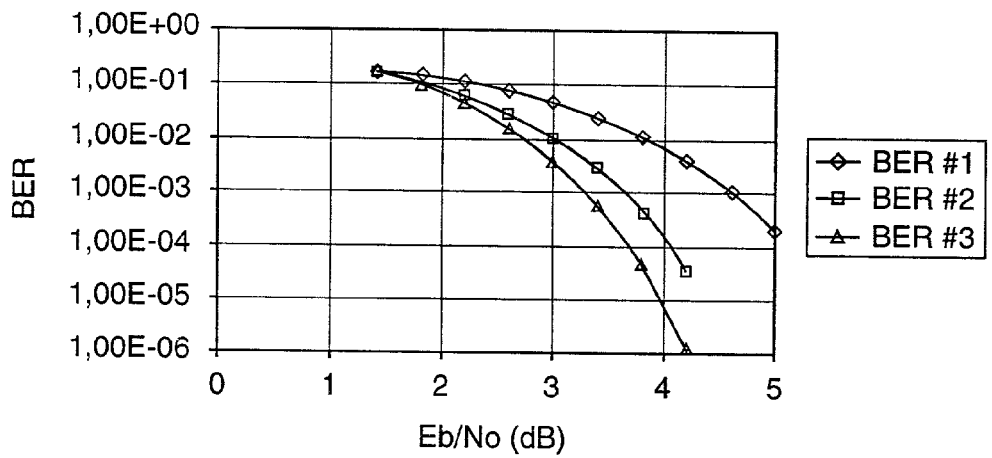

Finally, represented in FIG. 5c are simulation conditions similar to those of FIG. 5b, in which however the number of survivor paths implemented for the SOVA type equalization and joint detection process comprised a number of survivor paths Ω=6.

Although the decrease in the bit error rate BER as a function of the signal-to-noise ratio $Eb/N_0$ expressed in dB appears to be smaller than in the case of FIG. 5b, the gain in signal-to-noise ratio $Eb/N_0$, for a bit error rate $BER=1.00 \times 10^{-3}$ between the first and the third iteration #1, #3, is close to 1.5 dB.

The invention claimed is:

1. A method of coding a digital data stream coded by spatio-temporal combinations in multiple transmission and reception through a frequency selective channel, wherein said method comprises, on the basis of an initial digital data stream:
 subjecting said initial digital data stream to an outer coding by means of a first code of specified rate, so as to generate a coded digital stream;
 subjecting said coded digital stream, subdivided into successive blocks, to a blockwise interleaving process so as to generate a coded and interleaved digital stream;
 subjecting said coded and interleaved digital stream to a demultiplexing, said coded and interleaved digital stream being thus subdivided into a given number of elementary interleaved coded digital streams;

subjecting each elementary interleaved coded digital stream to an inner coding by means of at least one second code of specified rate, said at least one second code comprising a code of the spatio-temporal trellis coded modulation type, so as to generate a set of elementary digital streams, coded by spatio-temporal combinations;

transmitting each elementary digital stream comprising symbols over a transmission channel by means of a distinct transmission antenna, the set of said transmission antennas forming a space-diversity array, so as to generate a set of transmitted elementary digital streams exhibiting spatial and temporal diversity, thereby making it possible, on reception, to perform a decoding of the digital data stream coded by spatio-temporal combinations and comprised of said set of transmitted elementary digital streams, on the basis of a priori information representative of the spatial and temporal diversity.

2. The method of claim 1, wherein said at least one second code making it possible to achieve said inner coding is a unique code of specified rate, applied to each elementary interleaved coded digital stream.

3. The method of claim 1, wherein said at least one second code making it possible to achieve said inner coding is a distinct code of specified rate, applied to one of the elementary interleaved coded digital streams.

4. The method of claim 1, wherein said at least one second code making it possible to achieve said inner coding comprises a code of the spatio-temporal trellis coded modulation type, each code being applied to each elementary interleaved coded digital stream so as to generate a plurality of streams of modulation symbols, each stream of modulation symbols transmitted over the transmission channel emanating from a distinct transmission antenna, the groups of distinct transmission antennas for each code of the spatio-temporal trellis coded modulation type forming a sub-array of space-diversity antennas.

5. The method of decoding a digital data stream coded by spatio-temporal combinations in multiple transmission and reception through a frequency selective channel, said coded digital data stream comprising at least a set of elementary digital streams obtained by a first outer coding of an initial digital data stream by means of a first code of specified rate, blockwise interleaving of the coded digital stream emanating from this first outer coding, temporal demultiplexing of the coded and interleaved digital stream obtained on a specified number of demultiplexing pathways, this coded and interleaved digital stream being thus subdivided into one and the same number of elementary coded and interleaved digital streams, subjecting each elementary coded and interleaved digital stream to a second inner coding by means of at least one second code of specified rate, said at least one second code comprising a code of the spatio-temporal trellis coded modulation type, so as to generate said set of elementary digital streams, coded by spatio-temporal combinations, transmission of each elementary digital stream comprising symbols by means of a distinct transmission antenna, the set of the transmission antennas forming an array of said specified number of space-diversity transmission antennas, wherein said decoding method comprises:

receiving said digital data stream coded by spatio-temporal combinations which includes said set of elementary digital streams transmitted over a transmission channel on a plurality of reception antennas, the number of said reception antennas being independent of the number of transmission antennas and forming an array of space-diversity reception antennas so as to define a set of elementary streams of modulation symbols received;

subjecting said set of elementary streams of modulation symbols received to an iterative process of equalization of the transmission channel and of joint decoding, by means of said second inner coding on the basis of an extrinsic information stream on the bits coded by the first outer code and interleaved and emanating from a decoding on the basis of said outer code, said extrinsic information stream on the bits coded by the first outer code and interleaved constituting an a priori information item, so as to generate a first extrinsic information stream on the bits coded by the first outer code and interleaved;

subjecting said first extrinsic information stream to a deinterleaving so as to generate a second extrinsic information stream on the coded bits originating from the equalization and joint decoding process;

subjecting said second extrinsic information stream on the coded bits to a decoding on the basis of said first outer code, so as to generate a third extrinsic information stream on the coded bits, and emanating from the decoding on the basis of said first outer code;

subjecting said third extrinsic information stream to an interleaving, so as to generate said extrinsic information stream on the bits coded by the first outer code and interleaved, constituting said a priori information item;

reinjecting said a priori information item into the iterative process for equalization of the transmission channel and joint decoding.

6. The method of claim 5, wherein, for a second inner coding of the spatio-temporal trellis coded modulation type, said iterative process of equalization and joint decoding comprises:

demultiplexing said extrinsic information stream on the bits coded by the first outer code and interleaved, constituting said a priori information item, as a set of a priori information streams on the bits of user frames subdivided into packets;

performing an equalization and a joint decoding with soft input/output which are applied to a trellis with a reduced number of states, this trellis being defined as the product of the combined trellises of the spatio-temporal trellis coded modulations and of the elementary-memory channels referring thereto, which themselves have a reduced number of states, so as to generate a stream of weighted outputs on the bits of the user frames;

extracting from each stream of weighted outputs on the bits of the user frames said a priori information item on the bits of the user frames, so as to generate an extrinsic information stream on the bits of the user frames;

multiplexing the extrinsic information streams on the bits of the user frames, so as to generate said first extrinsic information stream on the bits coded by the first outer code and interleaved.

7. The method of claim 5, wherein said decoding by means of said first outer code comprises:

subjecting said second extrinsic information stream on the coded bits originating from the equalization and joint decoding process to a decoding with weighted input/output by means of said first outer code, so as to generate a stream of weighted outputs representative of an a posteriori information item on the coded bits;

subtracting said second extrinsic information stream from said stream of weighted outputs representative of said a posteriori information item on the coded bits, so as to generate said third extrinsic information stream on the coded bits.

8. A system for coding a digital data stream coded by spatio-temporal combinations in multiple transmission and reception through a frequency selective channel, said system comprising at least:
   means of outer coding of an initial digital data stream, on the basis of a first code of specified rate, so as to generate a coded digital stream, subdivided into successive blocks;
   means of blockwise interleaving making it possible, on the basis of said coded digital stream, to generate an interleaved coded digital stream exhibiting temporal diversity;
   demultiplexer means receiving said interleaved coded digital stream, making it possible to generate a given number of elementary interleaved coded digital streams;
   a plurality of means of inner coding on the basis of at least one second code of specified rate, said at least one second code comprising a code of the spatio-temporal trellis coded modulation type, each means of inner coding receiving one of said elementary interleaved coded digital streams, so as to generate a set of elementary digital streams, coded by spatio-temporal combinations comprising symbols;
   a plurality of transmission antennas for each elementary digital stream coded by spatio-temporal combinations comprising symbols, a distinct transmission antenna achieving the transmission of an elementary digital stream, the set of said transmission antennas forming a space-diversity array, said system making it possible to generate a set of transmitted elementary digital streams exhibiting spatial and temporal diversity, thereby making it possible, on reception, to perform a decoding of the transmitted elementary digital streams on the basis of a priori information representative of the spatial and temporal diversity.

9. The coding system of claim 8, wherein, for a second code making it possible to achieve said inner coding comprising a code of the spatio-temporal trellis coded modulation type, each code being applied to each elementary interleaved coded digital stream, so as to generate a plurality of streams of modulation symbols, said distinct transmission antennas are arranged in groups of antennas each transmitting a stream of modulation symbols, said groups of distinct transmission antennas for each type of spatio-temporal trellis coded modulation forming a sub-array of space-diversity antennas.

10. A system for decoding a digital data stream coded by spatio-temporal combination in multiple transmission and reception through a frequency selective channel, said coded digital data stream comprising at least of a set of transmitted elementary digital streams obtained by a first outer coding of an initial digital data stream by means of a first code of specified rate, blockwise interleaving of the coded digital stream emanating from said first outer coding, temporal demultiplexing of the coded and interleaved digital stream obtained on a specified number of demultiplexing pathways, said coded and interleaved digital stream being thus subdivided into one and the same specified number of elementary coded and interleaved digital streams, subjecting each elementary coded and interleaved digital stream to a second inner coding by means of at least one second code of specified rate, said at least one second code comprising a code of the spatio-temporal trellis coded modulation type, so as to generate said set of elementary digital streams, coded by spatio-temporal combinations, transmission of each elementary digital stream subdivided into symbols by means of a distinct transmission antenna according to a set of elementary streams transmitted over a transmission channel, the set of the transmission antennas forming an array of space-diversity transmission antennas, said decoding system comprising:
   a plurality of reception antennas making it possible to receive said set of elementary digital streams transmitted over said transmission channel, the number of said reception antennas being independent of the number of transmission antennas and forming an array of space-diversity reception antennas, so as to define a set of elementary streams of modulation symbols received;
   means of turbo-detection of said elementary streams of modulation symbols received by iterative equalization and iterative joint detection and iterative decoding, said turbo-detection means comprising:
   means of equalization of the transmission channel and of joint decoding, by means of said second inner coding on the basis of an extrinsic information stream on the bits coded by the first outer code and interleaved and which arises from a decoding on the basis of said outer code, said extrinsic information stream on said bits coded by the first outer code and interleaved constituting an a priori information item, said means of equalization of the transmission channel and of joint decoding making it possible, on the basis of said elementary streams of modulation symbols received, to generate a first extrinsic information stream on the bits coded by the first outer code and interleaved;
   means of deinterleaving said first extrinsic information stream, so as to generate a second extrinsic information stream on the coded bits originating from the means of equalization and of joint decoding;
   means of decoding on the basis of said first outer code receiving said second extrinsic information stream and making it possible to generate a third extrinsic information stream on the coded bits, which arises from the decoding on the basis of said first outer code;
   means of interleaving said third extrinsic information stream, so as to generate said extrinsic information stream on the bits coded by the first outer code and interleaved, constituting said a priori information item reinjected into said means of equalization of the transmission channel and of joint decoding.

11. The system of claim 10, wherein said means of equalization and of joint decoding comprise:
   a module for injecting said a priori information item comprising demultiplexer means receiving said a priori information item constituted by said extrinsic information stream on the bits coded by the first outer code and interleaved and delivering a set of a priori information streams on the bits of user frames, said set of streams being demultiplexed on one and the same number of demultiplexing pathways as the number of elementary coded and interleaved digital streams generated on transmission;
   means of decoding with weighted input/output receiving as input, on the one hand, said a priori information stream on the bits of user frames, and, on the other hand, said elementary streams of modulation symbols received and delivering a stream of weighted outputs on the bits of the user frames;

a plurality of subtractor means, making it possible to subtract from each stream of weighted outputs on the bits of the user frames, said a priori information item on the bits of user frames and delivering an extrinsic information stream on the bits of the user frames;

multiplexer means for multiplexing the extrinsic information streams making it possible, on the basis of said extrinsic information stream on the bits of the user frames, to deliver said first extrinsic information stream on the bits coded by the first code and interleaved.

12. The system of claim 10, wherein said means of decoding on the basis of said first outer code comprise:

a decoding module with weighted input/output receiving said second extrinsic information stream on the coded bits originating from the equalization and joint decoding process and delivering a stream of weighted outputs representative of an a postenori information item on the coded bits;

a subtractor module making it possible to subtract from said stream of weighted outputs representative of an a posteriori information item on the coded bits said second extrinsic information stream and delivering said third extrinsic information stream on the coded bits, which arises from the decoding on the basis of said first outer code.

* * * * *